(12) United States Patent
Takahashi et al.

(10) Patent No.: US 7,399,578 B2
(45) Date of Patent: Jul. 15, 2008

(54) ALKALINE SOLUTION AND MANUFACTURING METHOD, AND ALKALINE SOLUTION APPLIED TO PATTERN FORMING METHOD, RESIST FILM REMOVING METHOD, SOLUTION APPLICATION METHOD, SUBSTRATE TREATMENT METHOD, SOLUTION SUPPLY METHOD, AND SEMICONDUCTOR DEVICE MANUFACTURING METHOD

(75) Inventors: Riichiro Takahashi, Yokohama (JP); Kei Hayasaki, Kamakura (JP); Tomoyuki Takeishi, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/493,629

(22) Filed: Jul. 27, 2006

(65) Prior Publication Data
US 2007/0037099 A1 Feb. 15, 2007

Related U.S. Application Data

(62) Division of application No. 10/824,482, filed on Apr. 15, 2004, now Pat. No. 7,097,960, which is a division of application No. 10/144,025, filed on May 14, 2002, now Pat. No. 6,742,944.

(30) Foreign Application Priority Data

May 14, 2001 (JP) ............................. 2001-143682

(51) Int. Cl.
*G03F 7/32* (2006.01)

(52) U.S. Cl. .................. 430/311; 430/326; 430/331
(58) Field of Classification Search ............... 430/311, 430/326, 331
See application file for complete search history.

(56) References Cited

U.S. PATENT DOCUMENTS

| 3,029,145 A | 4/1962 | Dumers et al. |
| 3,697,275 A | 10/1972 | Hayakawa et al. |
| 3,782,944 A | 1/1974 | Hayakawa et al. |
| 4,547,450 A | 10/1985 | Maeda et al. |
| 5,984,540 A | 11/1999 | Mimasaka et al. |
| 6,076,979 A | 6/2000 | Mimasaka et al. |
| 6,089,762 A | 7/2000 | Mimasaka et al. |
| 6,372,413 B2 | 4/2002 | Ema et al. |
| 6,423,144 B1 | 7/2002 | Watanabe |
| 6,579,382 B2 * | 6/2003 | Ito ............................. 134/33 |

(Continued)

FOREIGN PATENT DOCUMENTS

EP 597100 * 5/1994

(Continued)

OTHER PUBLICATIONS

Office Action dated Dec. 10, 2004, issued by Chinese Patent Office in Chinese Patent Application No. 02119275.8.

(Continued)

*Primary Examiner*—Richard Schilling
(74) *Attorney, Agent, or Firm*—Finnegan, Henderson, Farabow, Garrett & Dunner L.L.P.

(57) ABSTRACT

A manufacturing method of an alkaline solution, comprising dissolving a gaseous molecule having oxidizing properties or reducing properties in an aqueous alkaline solution.

5 Claims, 19 Drawing Sheets

U.S. PATENT DOCUMENTS

| | | |
|---|---|---|
| 6,709,531 B2 | 3/2004 | Ito et al. |
| 2001/0018168 A1* | 8/2001 | Kosa et al. .................. 430/329 |
| 2001/0028920 A1* | 10/2001 | Ito et al. .................... 427/240 |
| 2002/0136971 A1 | 9/2002 | Ito et al. |
| 2002/0155391 A1 | 10/2002 | Takahashi et al. |

FOREIGN PATENT DOCUMENTS

| | | |
|---|---|---|
| JP | 4-162514 | 6/1992 |
| JP | 5-11458 | 1/1993 |
| JP | 5-303207 | 11/1993 |
| JP | 6-77123 | 3/1994 |
| JP | 6-95396 | 4/1994 |
| JP | 9-106081 | 4/1997 |
| JP | 10-99764 | 4/1998 |
| JP | 10-189419 | 7/1998 |
| JP | 10-303103 | 11/1998 |
| JP | 11-288877 | 10/1999 |
| JP | 2000-147793 | 5/2000 |
| JP | 2000-279902 | 10/2000 |
| JP | 2000-338684 | 12/2000 |
| JP | 2001-79504 | 3/2001 |
| JP | 2001-244164 | 9/2001 |
| JP | 2001-286833 | 10/2001 |
| JP | 3225101 | 11/2001 |
| WO | WO 99/60448 | 11/1999 |
| WO | WO 00/07220 | 2/2000 |

OTHER PUBLICATIONS

Notification of Reasons for Rejection issued by the Japanese Patent Office on May 15, 2007, for Japanese Patent Application No. 2001-143682, and English-language translation thereof.

Notification of Reasons for Rejection issued by the Japanese Patent Office on Nov. 28, 2006, for Japanese Patent Application No. 2001-143682, and English-language translation thereof.

* cited by examiner

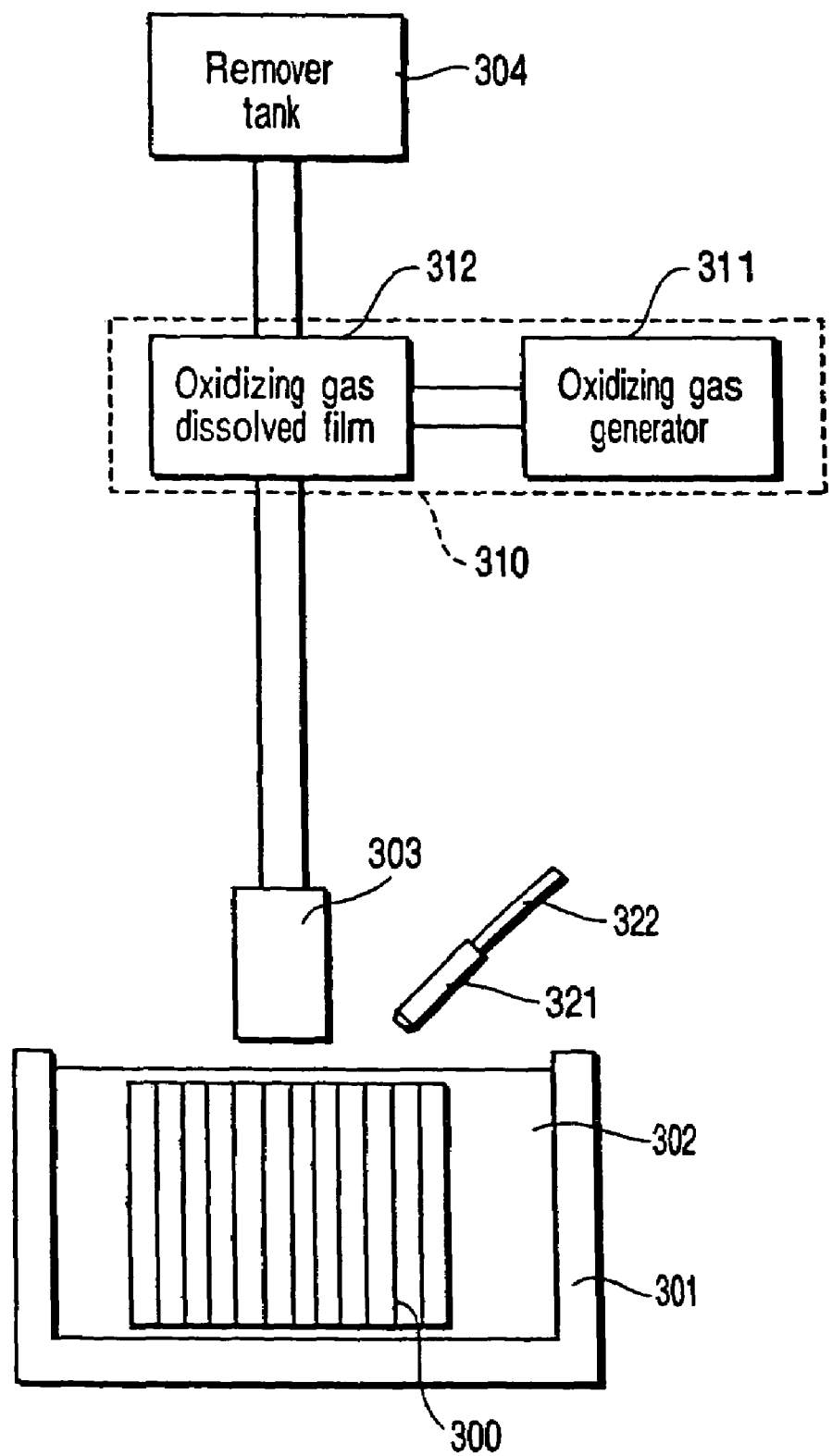
F I G. 6

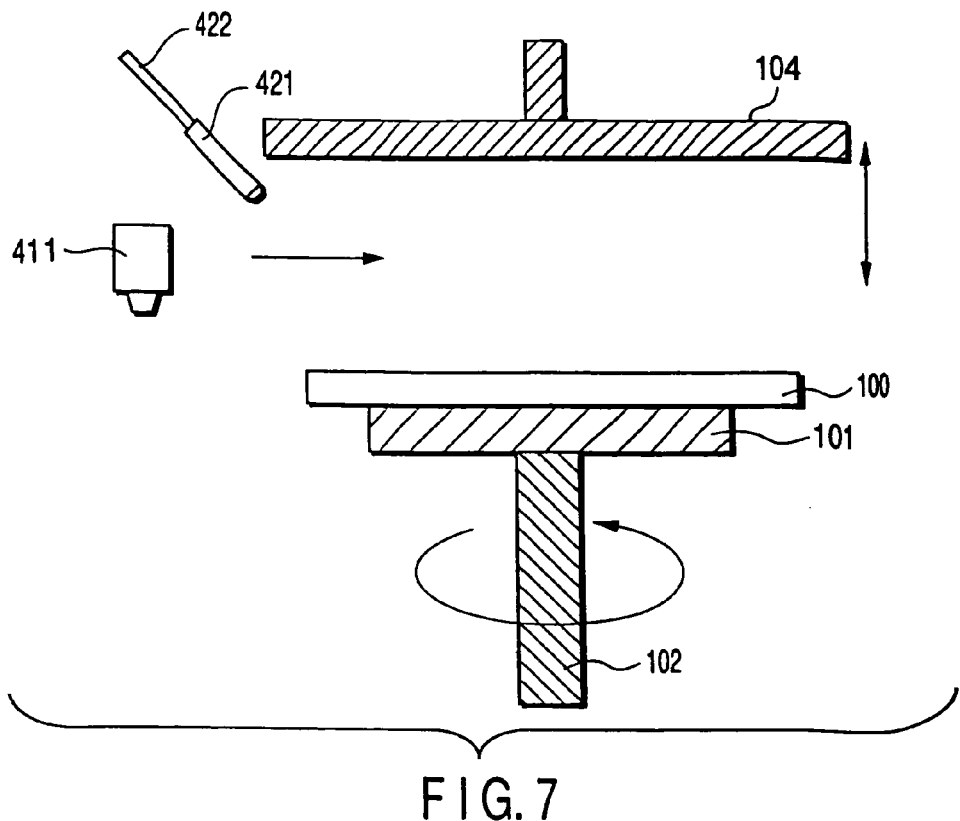
F I G. 7
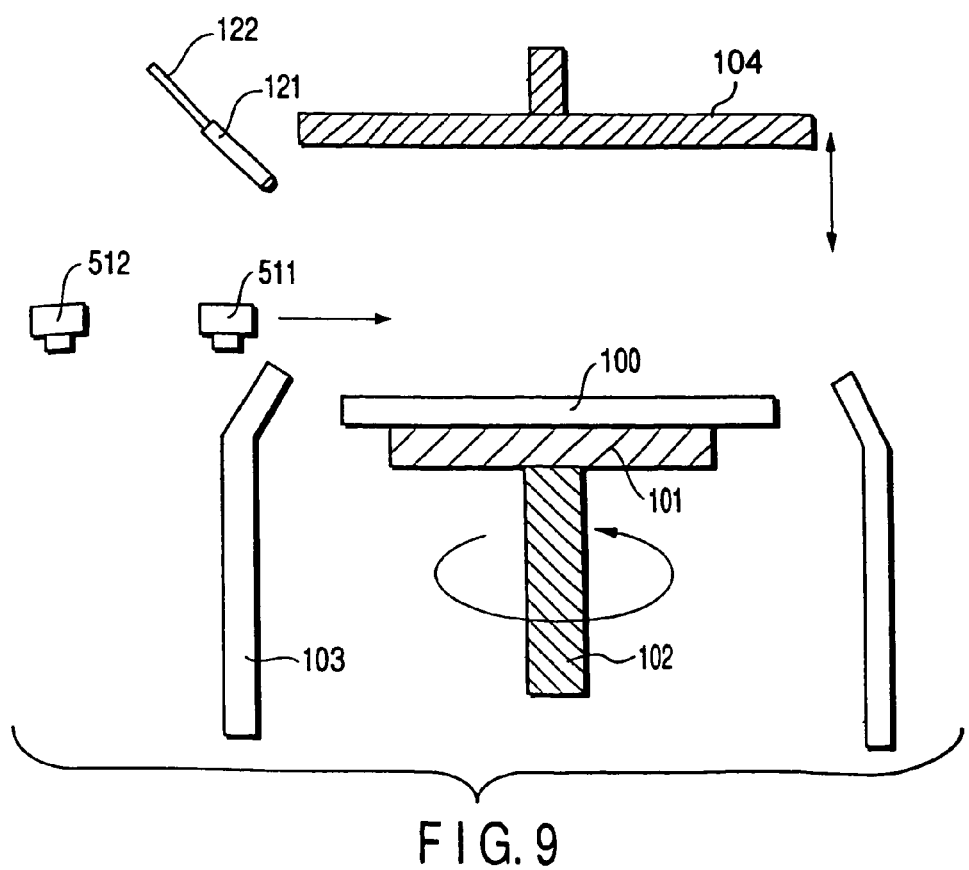
F I G. 9

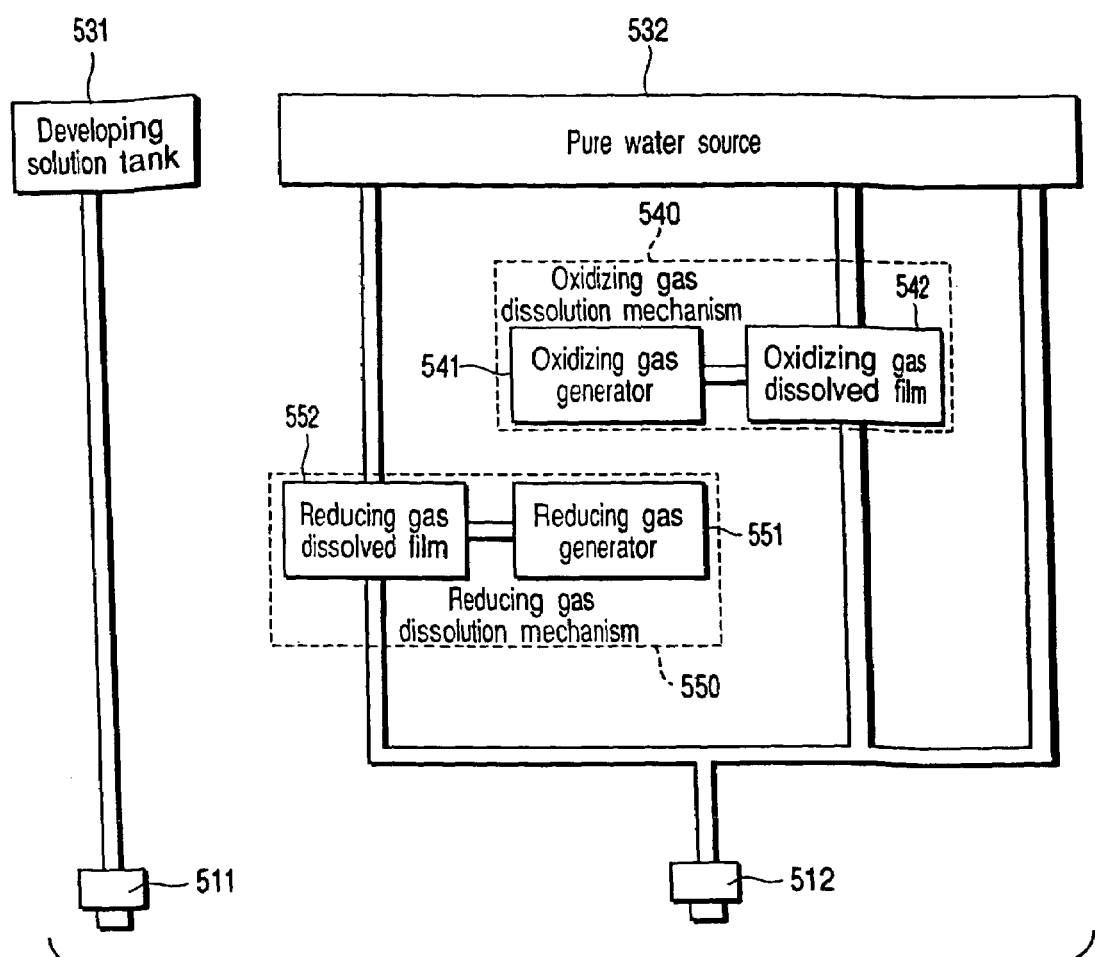
F I G. 10

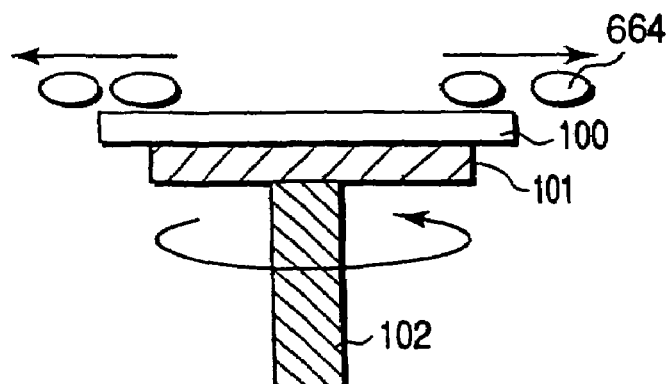
F I G. 14G
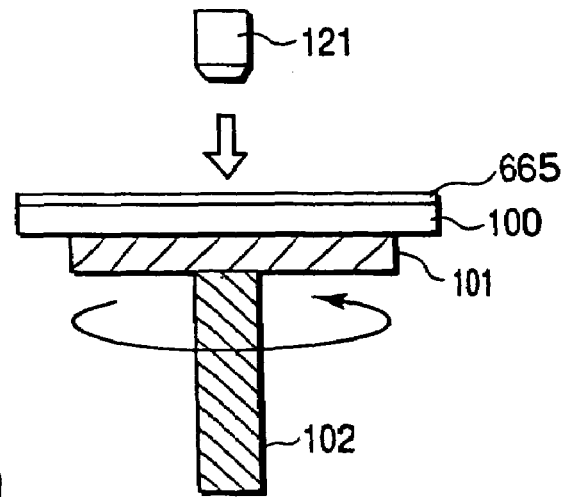
F I G. 14H
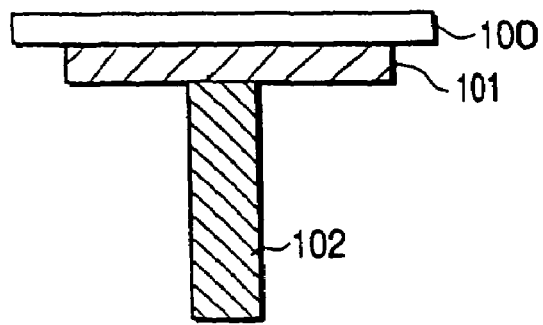
F I G. 14I

Start position    End position

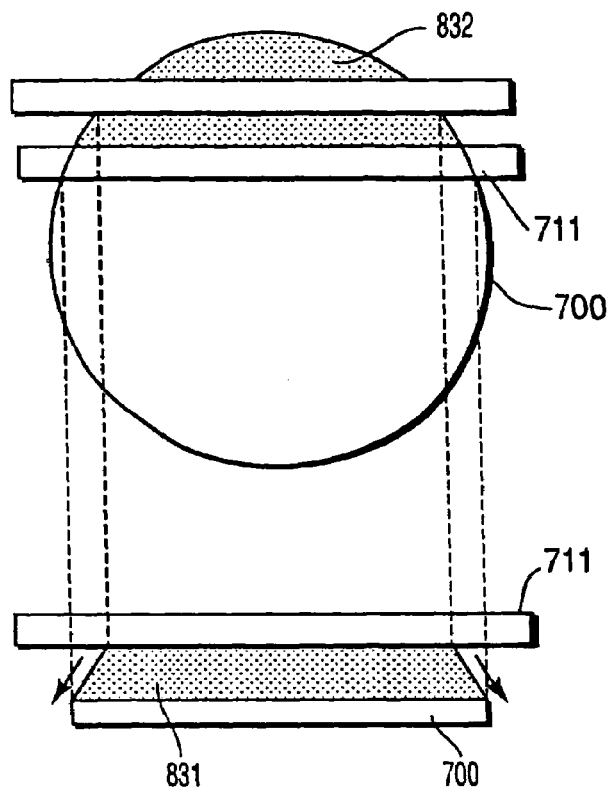
FIG. 19A
FIG. 19B
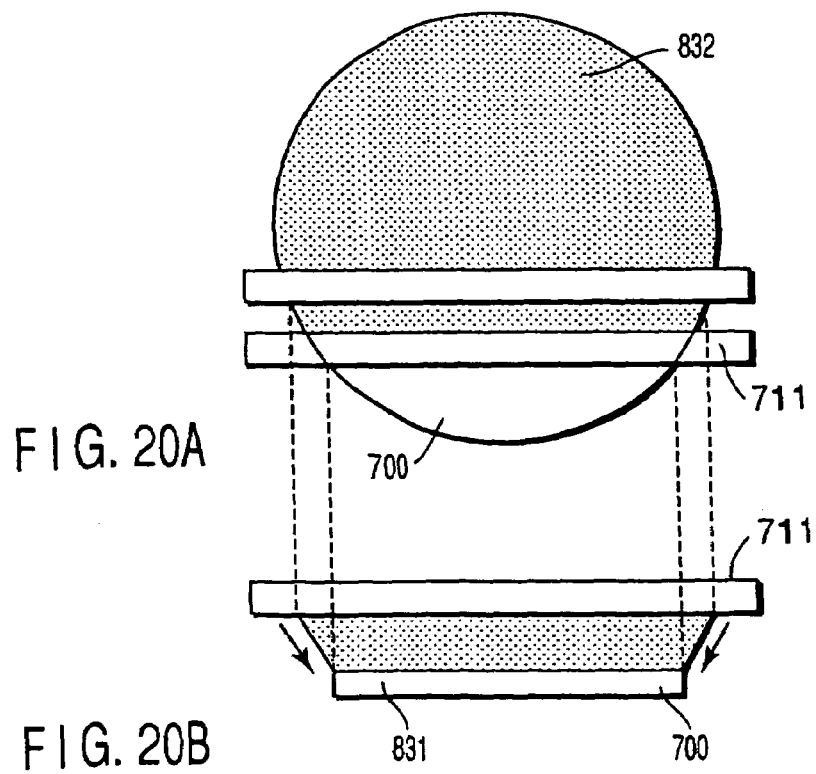
FIG. 20A
FIG. 20B

ALKALINE SOLUTION AND MANUFACTURING METHOD, AND ALKALINE SOLUTION APPLIED TO PATTERN FORMING METHOD, RESIST FILM REMOVING METHOD, SOLUTION APPLICATION METHOD, SUBSTRATE TREATMENT METHOD, SOLUTION SUPPLY METHOD, AND SEMICONDUCTOR DEVICE MANUFACTURING METHOD

CROSS-REFERENCE TO RELATED APPLICATIONS

This application is a division of application Ser. No. 10/824,482, filed Apr. 15, 2004, now U.S. Pat. No. 7,097,960 which is a division of application Ser. No. 10/144,025, filed May 14, 2002, now U.S. Pat. No. 6,742,944, based upon and claiming the benefit of priority from the prior Japanese Patent Application No. 2001-143682, filed May 14, 2001, all of which are incorporated herein by reference.

BACKGROUND OF THE INVENTION

1. Field of the Invention

The present invention relates to a manufacturing method of an alkaline solution for developing and removing a resist film, and the like and the alkaline solution, a pattern forming method using the alkaline solution, a removing method of a resist film, a solution application apparatus, a substrate treatment method prior to forming the resist film, and a solution supplying method of scanning a linear solution supply nozzle from one end to the other end of a substrate, and supplying the solution onto the substrate from the solution supply nozzle to form a solution film on the substrate.

2. Description of the Related Art

With the miniaturization of semiconductor elements and enlargement of a diameter of a substrate, in a conventional developing method, generation of a critical defect resulting from development, variation of a pattern size in a substrate surface and chip, and the like raise large problems.

In general, in a semiconductor manufacturing process, aqueous solutions such as alkaline tetramethyl ammonium hydroxide (TMAH) are used as a developing solution for a photosensitive resist film. Since the developing solution is an aqueous solution, wettability is not sufficient with respect to a photosensitive resist surface having a hydrophobic property. Therefore, when a reaction product resulting from neutralization is in the vicinity of the resist film surface, the developing solution is not easily diffused between the reaction product and the photosensitive resist surface. As a result, the reaction product cannot sufficiently be removed by pure water in a rinse process, and remains on the substrate and disadvantageously produces a defect.

Moreover, in a pattern disposed in a broad dissolution region, the amount of reaction products present in the vicinity of the pattern is large. Therefore, the developing solution is not easily diffused between the reaction product and the photosensitive resist film, and a progress of development is hindered. Therefore, for the pattern disposed in the broad dissolution region, as compared with a pattern disposed in a region whose periphery is hardly dissolved, there is a problem that a line size is increased.

It has previously been possible to solve these problems to some degree by using a developing solution with a surface-active agent added thereto to enhance affinity of the photosensitive resist surface for the developing solution. However, with the reduction in exposure wavelength, it has been necessary to maintain transparency/etching resistance of a resin in a short wavelength band, and a photosensitive resist material having a strong interaction between resins has been used. Therefore, when the developing solution with the surface-active agent added thereto is used, the wettability with the photosensitive resist film surface can be enhanced only to a certain degree. As a result, problems occur that defects are generated and a size difference is brought in a sparse/dense pattern.

Additionally, with the size miniaturization of the semiconductor element and the enlargement of the diameter of the substrate, in the conventional method, a size variation of the pattern in the substrate surface and chip, which is said to result from the development, raises a large problem. As a countermeasure, a technique of scanning a linear nozzle from one end to the other end of the substrate and forming a solution film evenly on the whole surface of the substrate has been proposed (Jpn. Pat. Appln. KOKAI Publication Nos. 10-303103 and 10-189419).

In the technique described in the Jpn. Pat. Appln. KOKAI Publication Nos. 10-303103 and 10-189419, it is disclosed that a gap between a supply position of the nozzle and the substrate is 0.3±0.1 mm, a flow rate of the developing solution is set to 1.5 L/min., a scanning speed of the nozzle is set to 10 to 500 mm/second and the solution film is formed. However, even when the solution film is formed in these conditions, the formed solution film thickness is not necessarily equal to the gap. Therefore, a size difference is disadvantageously produced in a substrate plane and chip depending on a subtle flow of the solution generated during the application of the solution. Concretely, since the formed solution film thickness is not equal to the gap, a subtle solution flow is generated during the application of the solution. When a dissolution region exists upstream of a solution flow, the etching speed drops due to an influence of reaction products. Conversely, when the upstream of solution flow is a non-dissolution region, the etching speed rises due to the fresh developing solution.

As described above, the photosensitive resist having a strong interaction between resins has been used, the defects are generated, and a size difference is disadvantageously produced in the sparse/dense pattern.

Moreover, in the technique of scanning a linear nozzle from one end to the other end of a substrate and forming a solution film evenly on the whole surface of the substrate, the size dispersion is disadvantageously produced in a substrate plane and chip due to the subtle solution flow generated during the application of the solution.

BRIEF SUMMARY OF THE INVENTION (1) According to one aspect of the present invention, there is provided a manufacturing method of an alkaline solution, comprising: dissolving a gaseous molecules in an aqueous alkaline solution and having oxidizing properties or reducing properties.

(2) According to one aspect of the present invention, there is provided a manufacturing method of an alkaline solution, comprising: mixing a solution in which a gaseous molecules having oxidizing properties or reducing properties is dissolved in a pure water with an aqueous alkaline solution to manufacture the alkaline solution.

(3) According to one aspect of the present invention, there is provided a pattern forming method comprising: a step of coating a substrate with a photosensitive resist film; a step of exposing the photosensitive resist film; a step of supplying a developing solution in which a gaseous molecules having oxidizing properties or reducing properties is dissolved to the photosensitive resist film, and developing the resist film; and a step of supplying a cleaning solution to the surface of the substrate, and cleaning the substrate.

(4) According to one aspect of the present invention, there is provided a removing method of a resist film, comprising a step of supplying an alkaline remover with a gaseous molecules having oxidizing properties or reducing properties dissolved therein to a substrate in which a pattern of a photosensitive resist film is formed on a base material and the resist film is used as a mask to subject the base material to an etching treatment, and removing the resist film; and a step of supplying a cleaning solution onto the substrate, and cleaning the substrate.

(5) According to one aspect of the present invention, there is provided a solution application apparatus comprising: a substrate holding base which holds a substrate; a gas dissolution mechanism including either one of a mechanism in which an oxidizing gas is dissolved in an alkaline solution and a mechanism in which a reducing gas is dissolved in the alkaline solution; an alkaline solution supply nozzle which supplies the alkaline solution in which a gaseous molecule having oxidizing properties or reducing properties is dissolved by the gas dissolution mechanism onto a main surface of the substrate: and a cleaning supply nozzle which supplies a cleaning solution to the substrate main surface.

(6) According to one aspect of the present invention, there is provided a substrate treatment method comprising: coating a substrate with a photosensitive resist film; exposing the photosensitive resist film; supplying a reducing solution to the surface of the exposed photosensitive resist film and performing a pretreatment; developing the pretreated resist film; and supplying a cleaning solution onto the substrate, and cleaning the substrate.

(7) According to one aspect of the present invention, there is provided a substrate treatment method comprising: coating a substrate with a photosensitive resist film; exposing the photosensitive resist film; supplying a developing solution to the photosensitive resist film, and forming a developing solution film; supplying a functional solution having oxidizing properties or reducing properties onto the substrate with the developing solution film formed thereon, and subsequently fluidizing the functional solution and the developing solution film; and a process of supplying a cleaning solution to the surface of the substrate, and cleaning the substrate.

(8) According to one aspect of the present invention, there is provided a solution supplying method of scanning a linear solution supply nozzle from one end to the other end of a substrate, and supplying a solution onto the substrate via the solution supply nozzle to form a solution film on the substrate, the method comprising: controlling at least one of a supply amount of a solution nozzle and a scanning speed of the solution supply nozzle so that a film thickness d of the solution film formed on the substrate is substantially equal to a gap H between a supply position of the solution supply nozzle and the substrate.

(9) According to one aspect of the present invention, there is provided a solution supplying method of scanning a linear solution supply nozzle from one end to the other end of a substrate, and supplying a solution onto the substrate via the solution supply nozzle to form a solution film on the substrate, the method comprising: setting a gap H (mm) between a supply position of the solution supply nozzle and the substrate to a value obtained by dividing a solution supply speed Q (µl/sec) from the solution supply nozzle by a product of a scanning speed V (mm/sec) of the solution supply nozzle and a length L (mm) of a discharge port of the solution supply nozzle.

(10) According to one aspect of the present invention, there is provided a solution supplying method of scanning a linear solution supply nozzle from one end to the other end of a substrate, and supplying a solution onto the substrate via the solution supply nozzle to form a solution film on the substrate, the method comprising: setting a solution supply speed Q (µl/sec) to a product of a gap H (mm) between a supply position of the solution supply nozzle and the substrate, a scanning speed V (mm/sec) of the solution supply nozzle, and a length L (mm) of a discharge port of the solution supply nozzle.

BRIEF DESCRIPTION OF THE SEVERAL VIEWS OF THE DRAWING

FIG. 6 is a diagram showing a schematic constitution of a resist removing apparatus according to a third embodiment.

FIG. 7 is a diagram showing a schematic constitution of the developing unit according to a fourth embodiment.

FIG. 9 is a diagram showing a schematic constitution of the developing unit according to a fifth embodiment.

FIG. 10 is a diagram showing a schematic constitution of a solution supply system of the developing unit shown in FIG. 9.

FIGS. 14A to 14I are process diagrams showing the developing process according to the sixth embodiment.

FIGS. 19A, 19B are diagrams showing the state of a developing solution supplied via the developing solution supply nozzle when the developing solution supply nozzle passes to a substrate middle from a supply start end.

FIGS. 20A, 20B are diagrams showing the state of the developing solution supplied via the developing solution supply nozzle when the developing solution supply nozzle passes to the developing solution supply start end from a substrate middle.

DETAILED DESCRIPTION OF THE INVENTION

Embodiments of the present invention will be described hereinafter with reference to the drawings.

First Embodiment

Figure 1:
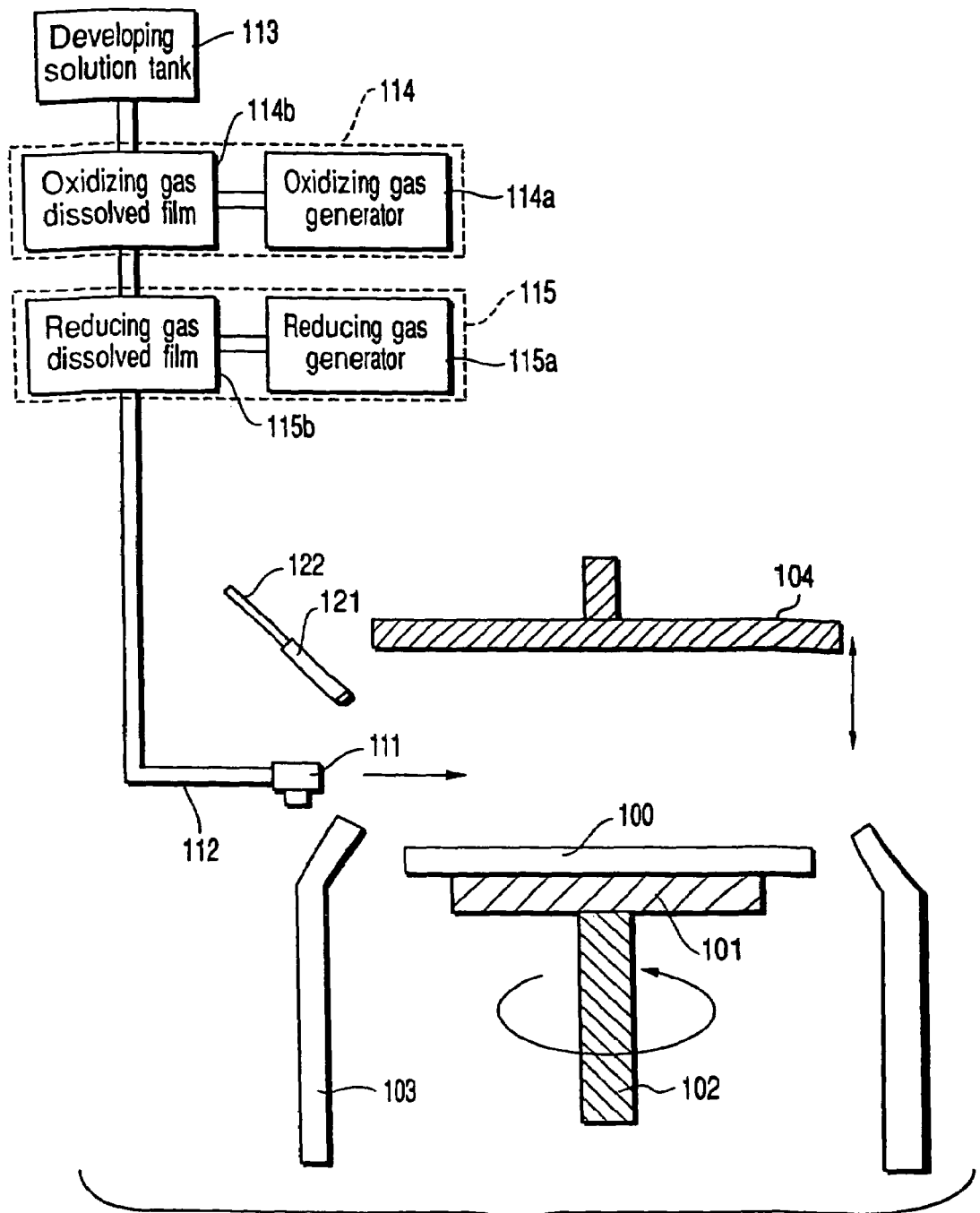
FIG. 1 is a diagram showing a schematic constitution of a developing unit according to a first embodiment.

FIG. 1 is a diagram showing a schematic constitution of a developing unit according to a first embodiment of the present invention.

In the present unit, as shown in FIG. 1, a fixed base 101 onto which a substrate 100 is fixed is connected to a rotation mechanism 102 for rotating the fixed base 101 and substrate 100. A protective cup 103 with which the periphery of the substrate 100 is covered is disposed in order to prevent a developing solution, cleaning solution, and the like on the substrate 100 from being scattered during rotation of the substrate 100 by the rotation of the rotation mechanism 102.

A developing solution supply nozzle 111 scanned on the substrate 100 is disposed. A developing tank 113 is connected to the developing solution supply nozzle 111 via a pipe 112. The deaerated developing solution is stored in the developing tank 113. The developing solution stored in the developing tank 113 is an aqueous solution such as alkaline tetramethyl ammonium hydroxide (TMAH). The developing solution has an alkali concentration which is not less than 1% and less than 4%.

In the pipe 112, an oxidizing gas dissolution mechanism 114 for dissolving oxidizing gases such as oxygen and ozone in the deaerated developing solution, and a reducing gas dissolution mechanism 115 for dissolving reducing gases such as hydrogen in the deaerated developing solution are inserted.

In the oxidizing gas dissolution mechanism 114, the deaerated developing solution is passed through an oxidizing gas dissolved film 114b into which a gas generated in an oxidizing gas generator 114a is introduced, and a gaseous molecules are dissolved in the developing solution. In the reducing gas dissolution mechanism 115, the deaerated developing solution is passed through a reducing gas dissolved film 115b into which a gas generated in a reducing gas generator 115a is introduced, and the gaseous molecules are dissolved in the developing solution. Additionally, the developing solution with the oxidizing gas dissolved therein will be hereinafter referred to as an oxidizing developing solution, and the developing solution with the reducing gas dissolved therein will be hereinafter referred to as a reducing developing solution. For example, a hollow fiber film of Teflon (trademark) is used in the oxidizing gas dissolved film 114b and reducing gas dissolved film 115b.

Additionally, the oxidizing gas dissolution mechanism 114 or the reducing gas dissolution mechanism 115 may be constituted to pass pure water through the dissolved film and dissolved the gaseous molecules, and subsequently to mix the developing solution having a concentration increased beforehand and generate the developing solution, as long as the oxidizing or reducing developing solution can be generated.

The developing solution supply nozzle 111 is scanned on the substrate 100 in one direction from the outside of the periphery of the substrate 100 by a scanning mechanism (not shown), and moves relatively with respect to the substrate 100. A length of the developing solution supply nozzle 111 in a direction vertical to the scanning direction is greater than the diameter of the substrate 100. The developing solution supply nozzle 111 is scanned on the substrate 100, the developing solution is discharged onto the substrate 100, and the whole surface of the substrate 100 is coated with the developing solution.

Moreover, a current plate 104 constituted of a flat rotary disc having a suction hole in a middle thereof, and an elevator mechanism of the current plate 104 are disposed above the substrate 100. When the current plate 104 rotates on the substrate 100, the developing solution applied onto substrate 100 is agitated.

Additionally, the developing solution supply nozzle 111 is not limited to the above-described embodiment, as long as the developing solution can be uniformly supplied onto the substrate. Moreover, the agitating mechanism is not limited to the above-described embodiment, as long as the mechanism has the action of agitating the developing solution during the developing.

A cleaning solution supply nozzle 121 for discharging a cleaning solution such as pure water supplied from a pure water transport line 122 onto the surface of the substrate 100 is disposed above the fixed base 101.

The developing unit shown in FIG. 1 has both the oxidizing gas dissolution mechanism 114 and the reducing gas dissolution mechanism 115, but only one of the mechanisms may be disposed, as circumstances demand. Moreover, when the oxidizing gas or the reducing gas is inline-supplied, the gas generators 114a, 115a are unnecessary.

A developing method of supplying the oxidizing developing solution as the developing solution to the surface of the substrate by the developing unit shown in FIG. 1 will next be described with reference to FIGS. 2A to 2F. FIGS. 2A to 2F are process diagrams showing a developing process according to the first embodiment. This developing process is used in a manufacturing process of a semiconductor device or a liquid crystal display.

Figure 2A:
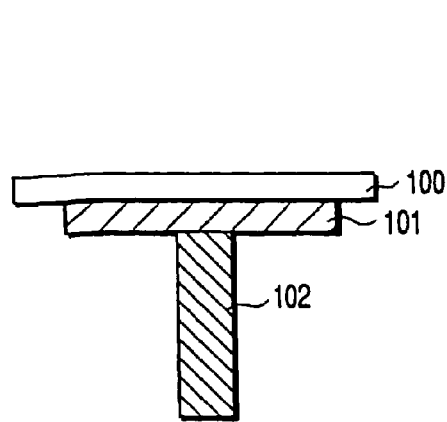
FIGS. 2A to 2F are process diagrams showing a developing process according to the first embodiment.

First, the substrate 100 is coated with an anti-reflection coating, and chemically amplified resist, and a desired pattern is reduced projection exposure via a reticle for exposure by a KrF excimer laser. After the substrate 100 is heat-treated (PEB), the substrate 100 is conveyed to the developing unit, and held on the fixed base 101 (FIG. 2A).

Figure 2B:
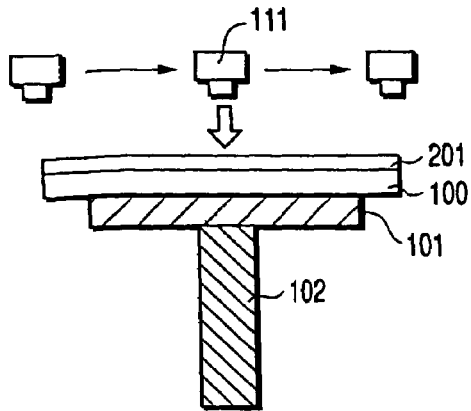

Subsequently, the developing solution supply nozzle 111 is scanned from one end to the other end of the substrate 100, and the oxidizing developing solution is discharged in a curtain form so that a developing solution film 201 is formed on the substrate 100 (FIG. 2B). A conventional developing solution is generated by adding a surfactant to the TMAH. In the present embodiment, the oxidizing developing solution formed by passing the developing solution through the oxidizing gas dissolved film 114b with the oxygen gas generated in the oxidizing gas generator 114a introduced therein is used.

Figure 2C:
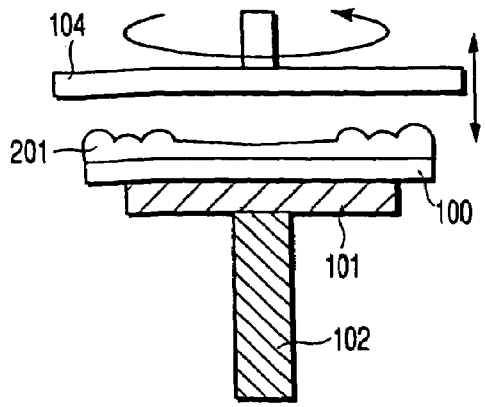

Subsequently, after moving downwards the current plate 104 to be above on the substrate 100, the current plate 104 is rotated at 3000 rpm and an air current is formed above the substrate 100. The developing solution film 201 is agitated by the formed air current (FIG. 2C). When the developing solution film 201 is agitated, concentration unevenness of the developing solution due to the reaction products in the developing solution film 201 is eliminated.

Figure 2D:
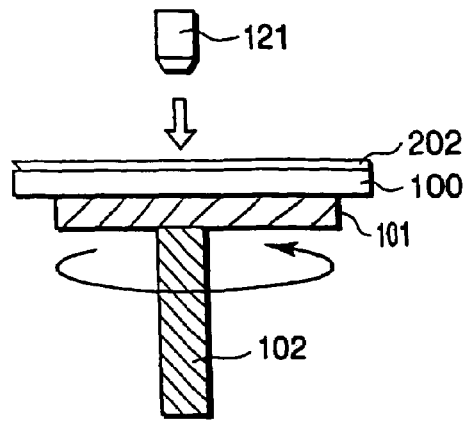

After an elapse of developing time in which a desired resist pattern is obtained, the substrate 100 is rotated, dissolved hydrogen water (reducing solution) 202 is discharged onto the substrate 100 via the cleaning solution supply nozzle 121 and the developing is stopped, and the developing solution, reaction product, and the like on the substrate 100 are rinsed for ten seconds (FIG. 2D). The dissolved hydrogen water is pure water with hydrogen dissolved therein.

When the dissolved hydrogen water is supplied as the cleaning solution to the substrate 100, an organic particle as the reaction product is reduced, and affinity between the organic particle and the resist surface is alleviated. When the affinity is alleviated, the organic particles are inhibited from adhering to the resist surface, and defects are inhibited from being generated.

Figure 2E:
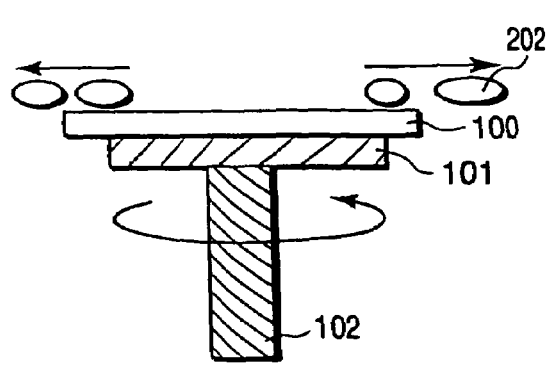

After the cleaning, the substrate 100 is rotated at a high speed, the dissolved hydrogen water 202 on the substrate 100 is thrown off by centrifugal force, and the substrate 100 surface is dried (FIG. 2E).

Figure 2F:
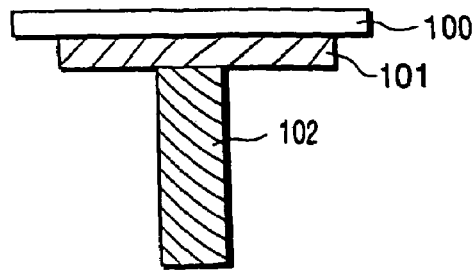

The developing process of the resist film is ended by the above-described treatment, and the substrate 100 is collected (FIG. 2F).

Additionally, the forming method of the developing solution film 201 is not limited to the method of scanning the developing solution supply nozzle 111 to the other end from one end of the substrate and forming the solution film. Examples of other methods include a method of relatively rotating the developing solution supply nozzle 111 and substrate 100 and discharging the developing solution to form the developing solution film, a method of spraying the developing solution uniformly onto the whole surface of the substrate via a spray nozzle to form the developing solution film, and the like. The method is not limited as long as the developing solution film can be formed uniformly on the substrate. Moreover, the agitating method of the formed developing solution film includes: rotating the current plate 104 on the substrate 100 to generate an air current. However, examples of the method include: a method of rotating the substrate 100, a method of vibrating the solution by a vibrator from the outside, and the like. Any method may be used as long as the method has an action of fluidizing the developing solution on the whole substrate surface.

As the oxidizing developing solution, a solution obtained by dissolving oxygen gaseous molecules in the developing solution is used. However, when a similar effect is produced, not only oxygen but also oxidizing gases such as ozone, carbon monoxide, and hydrogen peroxide may be used as the gaseous molecules to be dissolved. Moreover, pure water with the gaseous molecules dissolved therein may be mixed with a concentrated developing solution the functional developing solution. Additionally, to dissolve the gaseous molecules into pure water, deaerated pure water is passed through the dissolved film with the gaseous molecules introduced therein.

If the oxidizing developing solution has too high an oxidizing ability, it will oxidize and decompose not only the reaction product (later described), but also the resist. Consequently, the solution will damage the resist. In view of this, the gas should not be dissolved at an excessively high concentration in the solution. Ozone and hydrogen peroxide, which are strong oxidizing gases, should be dissolved at a concentration of 100 ppm or less in the oxidizing developing solution. On the other hand, oxygen and carbon monoxide, which are relatively weak oxidizing gases, should be dissolved at the saturation concentration or a lower concentration. In the present embodiment, oxygen is dissolved at a concentration of 10 ppm in the developing solution.

Moreover, any one of a reducing solution, oxidizing solution, and pure water may be used as the cleaning solution, as long as a sufficient effect can be obtained. Furthermore, when the cleaning effect is enhanced, these solutions may be appropriately combined. Particularly, a method of supplying the reducing solution onto the substrate and subsequently supplying pure water to perform the cleaning is preferable. This method further enhances the cleaning effect.

Furthermore, the method preferably includes: supplying oxidizing solutions such as ozonated water; cleaning the substrate; and continuously cleaning the substrate with reducing solutions such as dissolved hydrogen water. In this method, organic matter which is deposited in a process of replacing the developing solution with the cleaning solution and possibly adhere to the substrate are decomposed/removed, and therefore the cleaning effect is enhanced.

When the oxidizing developing solution with an appropriate amount of oxygen dissolved therein is used as the developing solution to perform the developing, roughly three actions are obtained during the developing. A first action includes oxidization of the reaction product generated immediately after the start of the developing by the oxygen molecules in the developing solution and decomposition of the reaction product by the oxidization. A second action includes the oxidization of the resist surface in the developing solution. A third action includes alleviation of size growth by cohesion of the reaction product generated during the developing. The above-described three actions will be described hereinafter in detail.

(1) First Action: Oxidization/Decomposition of Reaction Product

An exposed, heat-treated positive photosensitive resist film is immersed in the developing solution, an exposed portion is dissolved, and an unexposed portion is hardly undissolved. When the exposed portion of the photosensitive resist film contacts the developing solution in the developing process, the dissolution starts and simultaneously the reaction product by neutralization is generated. The reaction product is mixed into in the developing solution, but a part of the product is weakly bonded to a resist resin without being diffused between resist patterns, and remains between the resist patterns. The reaction product remaining between the resist patterns coheres, and forms an organic particle. In a region in which the exposed portion has a large area and a pattern size is fine, many organic particles exist, the concentration of alkali ions in the developing solution is lowered in the vicinity of the particles. As a result, the developing speed of the resist pattern locally slows in the vicinity of the particles, and the uniformity of the size of the resist pattern after the development is deteriorated. Moreover, when these organic particles adhere to the resist surface and cohere, the particles possibly remain as defects on the resist pattern after the development.

Figure 3A:
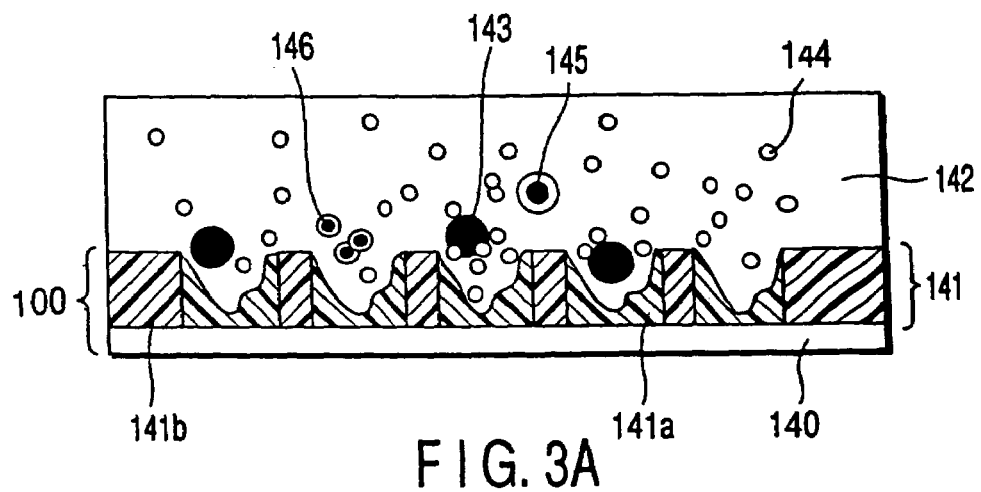
FIGS. 3A, 3B are explanatory views of an effect of use of a developing solution having oxidizing properties according to the first embodiment.

As shown in FIG. 3A, during the development, oxygen molecules 144 in a developing solution 142 collide with reaction products 143 caused by the development. It is further considered that the reaction products 143 are, to a certain extent to form oxide 145, and the oxide 145 is decomposed to form decomposed matter 146. A molecular mass of the decomposed matter 146 becomes low. Therefore, the decomposed matter 146 has a mass sufficiently reduced, and is therefore easily diffused in the solution. Additionally, in FIG. 3A, reference numeral 140 denotes a substrate, 141 denotes a positive photosensitive resist film, 141a denotes an exposed portion, and 141b denotes an unexposed portion.

Figure 3B:
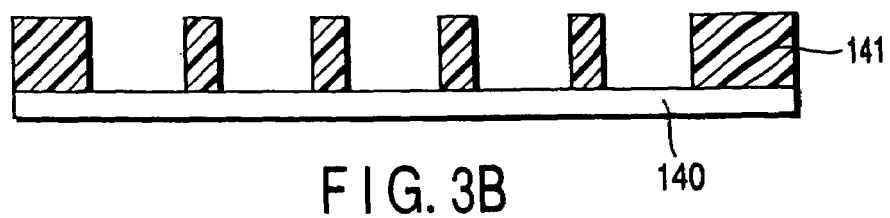

When the oxygen molecules 144 having a sufficient concentration exist in the developing solution 142, the reaction products 143 are oxidized and decomposed with an enhanced ratio. As a result, the diffusion of the reaction products 143 into the developing solution 142 is promoted, and the amount of organic particles collecting between the patterns of the resist 141 or in the vicinity of the surface of the resist 141 is reduced. Moreover, it can be expected that the alkali ions in the developing solution 142 are easily diffused in a reaction surface of the exposed portion 141a. As a result, local drops in the alkali ion concentration of the developing solution are inhibited, and developing speed unevenness in the substrate surface can be inhibited from being generated. Therefore, as shown in FIG. 3B, the uniform pattern of the resist film 141 is formed. Moreover, the organic particles are oxidized/decomposed, and diffused in the solution. Therefore, a probability at which an organic matter adhesion defect remaining on the resist pattern after the development is generated can remarkably be reduced.

(2) Second Action: Oxidation of Resist Surface

During the development, a strong affinity works between the molecules on the exposed portion surface of the photosensitive resist film and the alkali ions in the developing solution. On the other hand, when the molecules of the unexposed portion surface of the photosensitive resist film and the alkali ions in the developing solution approach each other, free energy becomes high, and a repulsive force operates. Therefore, in a region in which the ratio of the exposed portion to the unexposed portion of the resist film differs, the affinity received from the resist surface by the alkali ions largely differs. As a result, the amount of alkali ions reaching the resist film surface changes with the ratio of the exposed portion to the unexposed portion, and the progress of the development also changes. That is, the developing speed differs with place on the resist surface. Therefore, the uniformity of the resist pattern size after the development in the plane is deteriorated. When the oxygen molecules dissolved in the developing solution contact the resist surface during the development, the resist film surface is known to be oxidized. In the resist film surface of the unexposed portion in which the developing does not progress, the side wall of the pattern formed with the progress of the developing, and the like, carboxylic acid is generated by the oxidation by the oxygen molecules. The generated carboxylic acid has a relatively strong affinity with the alkali ions. Therefore, a difference in the affinity between the exposed portion and the unexposed portion is alleviated. As a result, a difference of the developing speed locally generated during the developing is reduced, and the uniformity within the plane is enhanced.

Moreover, there is a problem in the developing process that the defect is generated by the reaction product adhering to the resist surface. This is because the affinity due to intermolecular interaction works between the resist surface and the particle surface of the cohering reaction product. The oxygen molecules oxidizes the resist surface during the development, generates carboxylic acid, and changes the affinity by the intermolecular interaction in the resist surface and the surface of the reaction product particle. As a result, the reaction product particles possibly forming the defect after the development are inhibited from adhering to the resist surface. Therefore, by the developing using the oxidizing developing solution, the organic matter defect adhering to the resist pattern after the development can largely be inhibited from being generated in the developing process.

(3) Third Action: Inhibition of Cohesion of Reaction Product

During the development, the generated reaction products cohere in the developing solution, and the size gradually increases. In the first action, it has been described that the generated reaction products are oxidized and decomposed by oxygen in the developing solution. However, the amount of eluted reaction products, and further the number of molecules included in each reaction product is large as compared with the number of oxygen molecules in the solution. Therefore, it is impossible to oxidize and decompose all the products. The reaction products remaining undecomposed can be a core of cohesion in the solution. When these molecules exist the reaction products in the solution start cohering to the core. This cohesion is caused because the affinity of the reaction products is relatively strong under the environment, that is, particularly in the developing solution. That is, the molecules constituting the surface of the reaction product do not directly exert an interaction on the surface molecules of another reaction product present in the periphery. The molecules indirectly attract one another via the ions and molecules in the developing solution in order to further stabilize the state. Since the developing solution contains oxygen molecules, energy in an interface of the reaction product and developing solution can be lowered. Therefore, the affinity acting on the reaction products apparently is weakened. Even when the molecules as the prospective cores of cohesion exist in the solution, the probability of the cohesion starting actually from the core is sufficiently low as compared with when oxygen is not contained in the solution. Therefore, in the developing solution containing oxygen, the probability of the cohesion by the reaction products is reduced. Moreover, even for the reaction products starting to cohesion, since the affinity causing the cohesion is weakened, the growth speed slows. Therefore, the cohesion of the reaction products is inhibited.

Moreover, the difference of the affinity for the developing solution between the exposed portion and the unexposed portion is alleviated, and further the diffusion of the reaction products into the solution is promoted. From this action, in the agitating process during the development, even when a slight shaking force is applied, the agitating can efficiently be performed.

Results of an experiment actually performed by the inventor, et al. to check the effectiveness of the oxidizing developing solution will be described hereinafter.

The experiment was carried out according to the procedure described in the first embodiment. Moreover, for reference, the developing by the conventional developing solution, and the developing by the unagitated developing solution were carried out.

As the oxidizing developing solution, the solution manufactured by passing the deaerated developing solution through the dissolved film with the oxygen gaseous molecules introduced therein was used. Additionally, for a developing time, all the developing was performed under the same conditions. The results are shown in Table 1.

TABLE 1

|  | Linear Width (nm) | 3σ (nm) | Number of defects |
|---|---|---|---|
| Conventional developing solution | 201.5 | 9.2 | 245 |
| Oxidizing developing solution (without agitating) | 195.3 | 6.3 | 23 |
| Oxidizing developing solution (with agitating) | 192.7 | 4.0 | 18 |

As compared with the developing method using the conventional developing solution, in the developing method using the oxidizing developing solution, the value 3σ indicating size uniformity is enhanced. Furthermore, when the oxidizing developing is used and the developing solution is agitated during the developing, the size uniformity is remarkably enhanced. Moreover, after the development, the organic matter adhering defect numbers of these samples were measured. In the developing method using the conventional developing solution, 245 defects were measured in the whole surface of the substrate. However, when the oxidizing developing solution was used, 23 defects were found without the agitating process, and 18 defects were found with the agitating process. It was possible to remarkably reduce the number. From these results, the effects of the oxidizing developing solution and agitating were confirmed.

Moreover, when the oxidizing developing solution was used to perform the developing, the pattern size was found to decrease by about 2 to 3%. When the agitating process was further added, the pattern size was found to decrease by about 5%. The developing time for obtaining the desired pattern size was checked. It was found that the developing time was reduced to ¾ of the conventional developing time during the developing performed using the oxidizing developing solution and that the time was reduced to ⅔ of the conventional time with the addition of the agitating process. Therefore, when the oxidizing developing solution is used to developing process, it is possible to shorten the process time and enhance the throughput in the developing process by 25 to 30%.

Second Embodiment

The developing method of supplying the reducing developing solution as the developing solution to the surface of the substrate by the developing unit shown in FIG. 1 will next be described with reference to FIGS. 4A to 4F. FIGS. 4A to 4F are process diagrams showing the developing process according to a second embodiment.

Figure 4A:
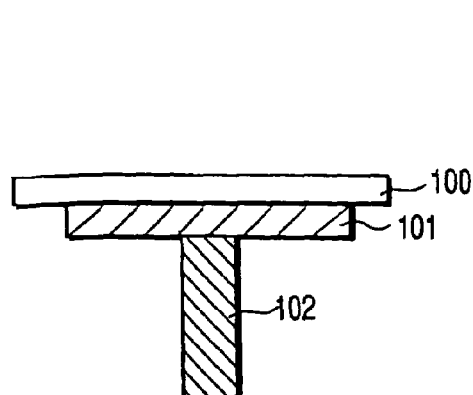
FIGS. 4A to 4F are process diagrams showing the developing process according to a second embodiment.

First, the substrate is coated with the anti-reflection coating, and chemically amplified resist, and the desired pattern is reduced projection exposure via the reticle for exposure by a KrF excimer laser. After the substrate is heat-treated (PEB), the substrate is conveyed to the developing unit, and held on the fixed base 101 (FIG. 4A).

Figure 4D:
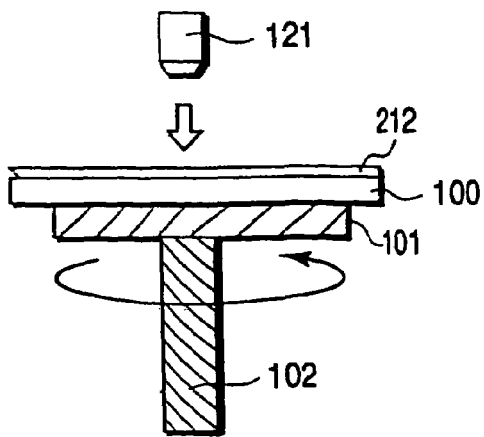
Figure 4B:
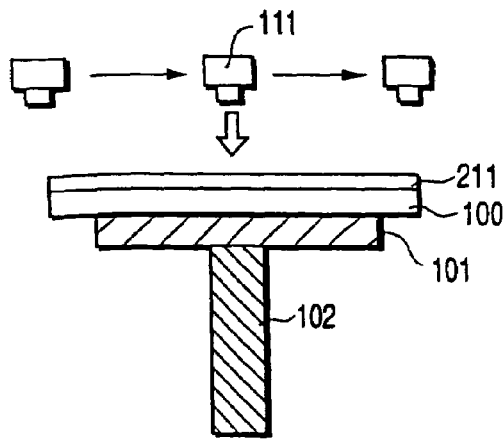

Subsequently, the developing solution supply nozzle 111 is scanned from one end to the other end of the substrate 100, and the reducing developing solution is discharged in a curtain form so that a developing solution film 211 is formed on the substrate 100 (FIG. 4B). The developing solution generated by adding the surface active agent to TMAH has heretofore been used. In the present embodiment, the reducing developing solution formed by passing the developing solution through the reducing gas dissolved film 115b with the hydrogen gas generated in the reducing gas generator 115a introduced therein is used.

Subsequently, after moving downwards the current plate 104 disposed on the substrate 100, the current plate 104 is rotated at 3000 rpm and the air current is formed on the substrate 100. The developing solution film 211 is agitated by the formed air current (FIG. 4C). When the developing solution film 211 is agitated, the concentration unevenness of the developing solution caused by the reaction product in the developing solution film 211 is eliminated.

After the elapse of the time in which the desired pattern is obtained, the substrate 100 is rotated, and ozonated water (oxidizing solution) 212 (pure water containing ozone) is discharged onto the substrate via the cleaning solution supply nozzle for ten seconds (FIG. 4D). The developing solution, reaction products, and the like are rinsed with the ozonated water, and the developing of the resist film is stopped. Ozonated water is a solution in which ozone gas, having oxidizing properties is dissolved in pure water. When ozonated water is supplied as the cleaning solution to the substrate 100, the organic particles remaining in the developing solution are oxidized/decomposed, and additionally, the resist film surface exposed after the development is oxidized. The organic particles are prevented from adhering to the resist surface, and the defects are inhibited from being generated in the resist surface.

Figure 4E:
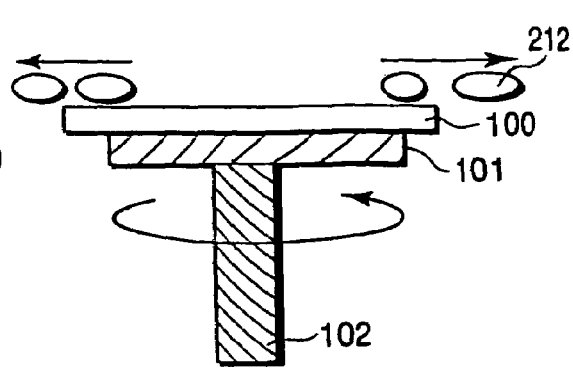
Figure 4C:
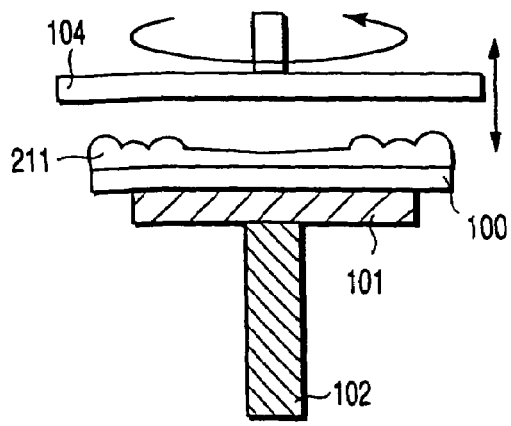

After the cleaning, the substrate 100 is rotated at high speed, the ozonated water 212 on the substrate 100 is thrown off by the centrifugal force, and the substrate 100 surface is dried (FIG. 4E).

Figure 4F:
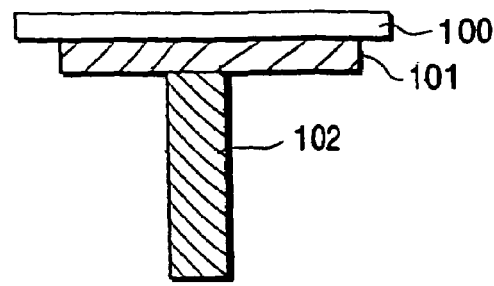

The developing process of the resist is ended by the above-described treatment, and the substrate 100 is collected (FIG. 4F).

Additionally, the forming method of the developing solution film 211 is not limited to the method of scanning the developing solution supply nozzle 111 to the other end from one end of the substrate and forming the solution film. Examples of other methods are a method of relatively rotating the developing solution supply nozzle 111 and substrate 100 and discharging the developing solution via the nozzle 111 to form the developing solution film 211, a method of spraying the developing solution uniformly onto the whole surface of the substrate 100 via the spray nozzle to form the developing solution film, and the like. The method is not limited as long as the developing solution can be uniformly discharged onto the substrate and the film can uniformly be formed. Moreover, the agitating method of the formed developing solution film includes: rotating the current plate on the substrate to generate the air current. However, examples of other methods are: a method of rotating the substrate, a method of vibrating the solution by vibration from the outside, and the like. Any method may be used as long as the method has the action of fluidizing the developing solution on the whole substrate surface.

As the reducing developing solution, a hydrogen molecule dissolved developing solution obtained by passing the deaerated developing solution through the reducing gas dissolved film with a hydrogen gaseous molecule introduced therein and dissolving the hydrogen gaseous molecule in the developing solution is used. However, when similar effect is produced, not only hydrogen but also reducing gases such as $H_2S$, $HNO_2$, and $H_2SO_3$ may be used as the gaseous molecule to be dissolved. Moreover, instead of passing the developing solution through the dissolved film and dissolving the molecule, the pure water with the reducing gas dissolved therein may be mixed with the developing solution having the concentration increased beforehand to generate the reducing developing solution.

Moreover, any one of the reducing solution, oxidizing solution, and pure water may be used as the cleaning solution, as long as sufficient effect can be obtained. Furthermore, when the cleaning effect is enhanced, these solutions may appropriately be combined. Particularly, the method of supplying the oxidizing solution and subsequently supplying the pure water to clean the substrate is preferable. Moreover, particularly preferable methods are: supplying the oxidizing solutions such as the ozonated water onto the substrate to clean the substrate; and continuously cleaning the substrate with the reducing solutions such as the dissolved hydrogen water.

The action of using the reducing developing solution to develop the image in the second embodiment will be described.

When the reducing developing solution with the gas having reducing properties dissolved at an appropriate concentration therein is used as the developing solution to develop the image, roughly three actions are obtained during the development as follows.

1. Resist film surface property modification by the hydrogen molecules
2. Promotion of diffusion of the reaction product into the developing solution
3. Prevention of re-adhesion of the reaction product onto the resist film surface These three actions will be described hereinafter in detail.

(1) Resist Surface Property Modification

For the exposed and heat-treated positive photosensitive resist film, during the development, the affinity between the molecules of the exposed portion surface of the resist and the alkali ions in the developing solution is different in strength from the affinity between the molecules of the unexposed portion surface of the resist and the alkali ions. Therefore, in the region in which the area ratio of the exposed portion to the unexposed portion on the resist film to be treated differs, the affinity received from the resist surface by the alkali ions in the developing solution largely differs. As a result, the amount of the alkali ions flowing into the resist surface changes with the area ratio of the exposed portion to the unexposed portion, and the progress speed of the development also changes. That is, the developing speed differs with the place on the resist surface to be treated. Therefore, the uniformity of the resist pattern size after the development is deteriorated.

Figure 5A:
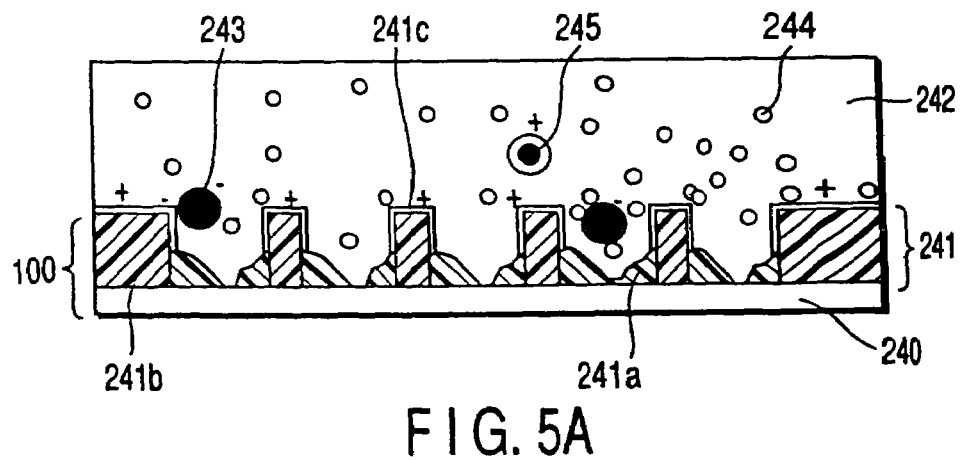
FIGS. 5A, 5B are explanatory views of an effect of use of the developing solution having reducing properties according to the second embodiment.

As shown in FIG. 5A, during the development, hydrogen molecules 244 dissolved in a developing solution 242 have an action of reducing the surface of a resist film 241 upon contacting the resist film 241 surface on a substrate 240. Therefore, the difference of the affinity of the developing solution for the surface of an exposed portion 241a from the affinity of the surface of a reduced resist film 241c of an unexposed portion 241b for the developing solution is alleviated. As a result, the difference of the developing speed locally generated during the development is reduced, and the size uniformity after the development is enhanced.

(2) Promotion of Diffusion of Reaction Products into Developing Solution

For the positive resist film, in the developing process, the exposed portion is dissolved in the developing solution, whereas the unexposed portion has a property of being hardly dissolved. This is because for the exposed portion of the photosensitive resist, the reaction products generated by the neutralization with the developing solution are dissolved in the developing solution. However, when the area ratio of the exposed portion to the unexposed portion on the resist differs, the generated amount of the reaction products largely differs. For example, with an isolated pattern, since a broad exposed portion exists in the periphery, the amount of reaction products is remarkably large as compared with a line & space (L/S) pattern. Since the generated reaction products easily remain between the patterns, and are not easily diffused in the developing solution, the alkali concentration of the developing solution around the isolated pattern is low as compared with the alkali concentration of the L/S pattern. Therefore, a time necessary for forming the desired pattern size differs with the pattern. That is, since the time required for the development differs with the difference of the pattern, a sparse/dense size difference of the resist pattern size after the development disadvantageously increases. For the sparse/dense difference, it is difficult to completely remove the reaction products only by agitating the products in the course of the development and improve the size difference.

Figure 5B:
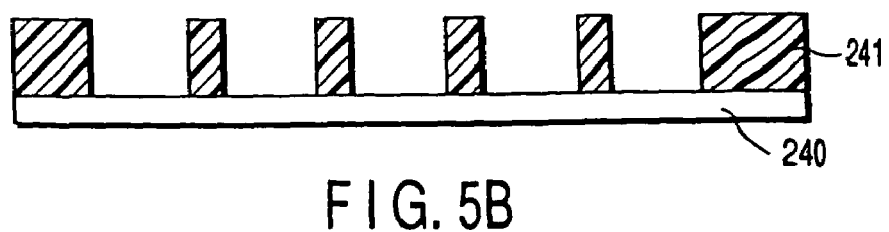

As shown in FIG. 5A, when the hydrogen molecules 244 added to the developing solution are reduced/reacted with the reaction products 243 generated by the neutralization to form a reduced matter 245, a surface potential of the reduced matter 245 changes. Thereby, a repulsive force is generated between the reduced matter 245, thus preventing cohesion therein, so that the reaction products are easily diffused in the developing solution, and the development progresses. That is, when the surface potential of the reaction products 243 is changed by the hydrogen molecules 244, the sparse/dense size difference generated by the alkali concentration difference of the developing solution 242 can largely be reduced, and the uniform pattern of the resist 241 can be formed as shown in FIG. 5B.

(3) Alleviation of Cohesion of Reaction Product

Even when the reaction products generated by the developing reaction are once diffused in the developing solution, the reaction products later possibly cohere by the interaction acting among the reaction products in the solution. Therefore, the problem is that the cohering reaction products again adhere onto the resist and form the defects.

When the hydrogen molecules are dissolved in the developing solution, the hydrogen molecules have an effect of modifying the reaction products or the surface state of the resist. Thereby, the degree of the intermolecular interaction acting among the reaction products can be weakened, and the hydrogen molecules in the developing solution can inhibit the reaction products from cohering. That is, the amount of the reaction products again adhering to the resist surface is decreased, and the amount of defects caused by the re-adhesion of the cohering reaction products onto the resist surface are largely suppressed.

Moreover, the difference of the affinity of the exposed portion/unexposed portion for the developing solution is alleviated. Further from an action of promoting the diffusion of the reaction products into the solution, in the agitating process during the development, when only a slight shaking force is applied, the solution can efficiently be agitated.

The results of the experiment actually performed by the inventor, et al. will be described hereinafter.

The experiment was carried out according to the procedure described in the second embodiment. Moreover, for reference, the development by the conventional developing solution, and the development in which the reducing developing solution was used to development without agitating the solution during the development were carried out.

As the reducing developing solution, the solution obtained by passing the hydrogen gaseous molecules through the deaerated developing solution was used. The results are shown in Table 2.

TABLE 2

| | CD (nm) | 3σ (nm) | Number of defects |
|---|---|---|---|
| Conventional developing solution | 201.5 | 9.2 | 245 |
| Reducing developing solution (without agitation) | 194.9 | 6.9 | 86 |
| Reducing developing solution (with agitation) agitating | 192.2 | 4.1 | 58 |

As compared with the developing method by the conventional developing solution, in the developing method by the reducing developing solution, the value of 3σ indicating the size uniformity is enhanced. Furthermore, when the reducing development is used and the developing solution is agitated during the development, the size uniformity is remarkably enhanced. Moreover, after the development, the organic matter adhering defect numbers of these samples were measured. In the developing method by the conventional developing solution, 245 defects were measured in the whole surface of the substrate. However, when the oxidizing developing solution was used, 86 defects were found without the agitating process, and 58 defects were found with the agitating process. It was possible to reduce the number.

Moreover, when the reducing developing solution was used to perform the development, the pattern size was found to decrease by about 2 to 3%. When the agitating process was further added, the pattern size was found to decrease by about 5%. The developing time for obtaining the desired pattern size was checked. It was found that the developing time was reduced to ¾ of the conventional developing time during the development performed using the reducing developing solution and that the time was reduced to ⅔ of the conventional time with the addition of the agitating process. Therefore, when the reducing developing solution is used to develop the image, it is possible to shorten the process time and enhance the throughput in the developing process by 25 to 30%.

Third Embodiment

FIG. 6 is a diagram showing a schematic constitution of a resist removing apparatus according to a third embodiment of the present invention.

As shown in FIG. 6, the present apparatus includes a treatment tank 301 in which an oxidizing remover 302 described later is stored. When a wafer cassette 300 with a plurality of substrates stored therein is immersed in the oxidizing removing solution 302, the resist on the substrate surface is removed.

The present apparatus further includes an oxidizing gas dissolution mechanism 310 for generating the oxidizing remover 302 stored in the treatment tank 301. The oxidizing gas dissolution mechanism 310 dissolves the oxidizing gas with respect to the deaerated removing solution stored in a removing solution tank 304, and generates the oxidizing removing solution 302. The generated oxidizing removing solution is supplied into the treatment tank 301 via a removing solution supply nozzle 303. The oxidizing gas dissolution mechanism 310 passes the deaerated removing solution through the an oxidizing gas dissolved film 312 in which the gas generated by an oxidizing gas generator 311 is introduced, and dissolves the gaseous molecules in the developing solution.

In the third embodiment, a high-concentration alkaline solution is used as the remover stored in the remover tank 304. Here, a remover such as aqueous tetra methyl ammonium hydroxide (TMAH) solution is used. An alkali concentration range is preferably not less than 1% and not more than a saturated concentration. Moreover, the concentration of oxygen dissolved in the remover is preferably 10 ppm or more.

A developing solution in which oxygen molecules are dissolved is used as an oxidizing remover. Nonetheless, the gas molecules dissolved in the solution are not limited to oxygen molecules. Molecules of any other oxidizing gas, such as ozone, carbon monoxide or hydrogen peroxide, may be dissolved in the remover if they achieve the same effect as oxygen molecules. A mixture of a high-concentration developing solution and pure water containing gas molecules dissolved in it may be used as an oxidizing remover.

If the oxidizing remover has too high an oxidizing ability, it will oxidize the layer onto which it has been applied. The remover will damage the layer. Hence, the gas should not be dissolved in the remover at an excessively high concentration. Ozone and hydrogen peroxide, which are strong oxidizing gases, should be dissolved at a concentration of 100 ppm or less in the oxidizing remover. By contrast, oxygen and carbon monoxide, which are relatively weak oxidizing gases, should be dissolved in the oxidizing remover at the saturation concentration or a lower concentration.

Moreover, the present apparatus includes a cleaning solution supply nozzle 321 for supplying the cleaning solution transported via a cleaning solution transport line 322 into the treatment tank 301 after removing a resist residual from the substrate surface.

The substrate is coated with the anti-reflection coating and chemically amplified resist, and the desired pattern is reduced projection exposure via the reticle for exposure by a KrF excimer laser. After the substrate is heat-treated, the resist pattern is formed by a developing treatment. Thereafter, the resist pattern is used as a mask to etch the pattern. The substrate stored in the wafer cassette 300 is immersed in the oxidizing remover 302 in the treatment tank 301, and the remaining resist residual is removed. After discharging the oxidizing remover 302 from the treatment tank 301, the pure water is supplied into the treatment tank via the cleaning solution supply nozzle 321, and the substrate in the wafer cassette 300 is cleaned. Additionally, after the etching, ashing may be performed, and then the removing process may be performed.

In the third embodiment, the pure water is used as the cleaning solution after the alkali treatment. However, if the cleaning effect is enhanced, the oxidizing solutions such as the ozonated water and/or the reducing solutions such as the dissolved hydrogen water may be used as the cleaning solution.

When the oxidizing remover with oxygen dissolved therein is used as the resist remover to remove the resist residual, the following action is obtained.

Oxidation/Decomposition/Removing of Resist Film after Etching

The resist residual exists on the substrate after the etching. Most part of the resist is dissolved by the high-concentration alkaline solution. However, when the oxygen molecules are dissolved, during the removing, the oxygen molecules in the remover collide against the resist residual, and are considered to oxidize and decompose the resist residual with a certain probability. Since a molecular mass of the decomposed resist residue becomes low. Therefore, the decomposed resist residue has a mass sufficiently reduced, the residue is easily diffused into the remover. The probability of generation of organic matter adhering defects (resist residue) on the substrate after the removing can remarkably be reduced.

The results of the experiment performed in order to check the effect of the oxidizing remover by the inventor, et al. will be described hereinafter.

After the etching on conditions shown in the following table, the removing treatment was performed. The substrate was immersed in the alkaline solution for a predetermined time, rinsed with a ultrapure water, and dried, and a removing state was observed by an electron microscope. The results are shown in Table 3.

TABLE 3

| Developing solution | | Addition | | removing condition | | removing |
|---|---|---|---|---|---|---|
| Type | Conc. | Type | Conc. | Temp. | Time | state |
| TMAH | 2% | None | 0 ppm | 40° C. | 5 min. | Δ |
| TMAH | 2% | None | 0 ppm | 40° C. | 5 min. | ○ |
| TMAH | 2% | Oxygen | 20 ppm | 40° C. | 5 min. | ◎ |

Δ: almost remaining
○: partially remaining
◎: completely removed

From the above, it is seen that the resist residual removed by the remover obtained by dissolving oxygen as the oxidizing gas in the high-concentration alkaline solution can sufficiently be removed.

Additionally, the gas to be dissolved in the remover is not limited to the oxidizing gas. For example, the reducing gas may be used as long as the similar effect is obtained as a result. For example, when the hydrogen molecules are dissolved, the concentration is preferably about 1 PPM.

Additionally, when the resist residual is removed, the method is not limited to the above-described immersing method. A treatment of supplying the remover onto the substrate via the solution supply nozzle (a spray nozzle or a straight nozzle), and supplying the solution via a rinse nozzle after the treatment may be used. Moreover, during the treatment, a heating treatment, or a agitating treatment by an ultrasonic wave, or the like may be carried out.

Fourth Embodiment

FIG. 7 is a diagram showing the schematic constitution of the developing unit according to a fourth embodiment of the present invention.

As shown in FIG. 7, the developing unit includes the fixed base 101 onto which the substrate 100 is fixed, the rotation mechanism 102 for rotating the fixed base 101 and substrate 100, a solution supply nozzle 411 for discharging the dissolved hydrogen water and developing solution, and a driving mechanism for scanning the solution supply nozzle 411 onto the substrate 100. Furthermore, the developing unit includes the current plate 104 disposed as a agitating mechanism for agitating the developing solution on the substrate during the development above the substrate, and an elevator mechanism of the current plate 104. Additionally, the developing unit includes a cleaning solution supply nozzle 421, disposed above the substrate 100, for supplying the cleaning solution transported via a cleaning solution transport line 422 onto the substrate 100 surface.

The solution supply nozzle 411 has a plurality of independent supply ports, and discharges the dissolved hydrogen water and developing solution independently via the respective supply ports. Moreover, during the discharging of the solution, the solution supply nozzle 411 scans in one direction from the outside of the periphery of the substrate 100 onto the substrate 100 and discharges the solution. The current plate 104 of the agitating mechanism is a flat rotary disc having a suction hole in the middle thereof. The solution supply nozzle 411 is not limited to the above-described embodiment, as long as the solution can be uniformly supplied onto the substrate. Moreover, the agitating mechanism is not limited to the above-described embodiment, as long as the mechanism has an action of agitating the developing solution. Moreover, when uniform development is sufficiently performed, the agitating mechanism is not needed.

The developing method in which the developing unit is used will next be described with reference to FIGS. 8A to 8G. FIGS. 8A to 8G are process diagrams showing the developing method according to the fourth embodiment.

Figure 8A:
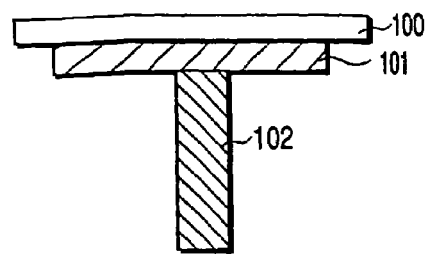
FIGS. 8A to 8G are process diagrams showing a developing method according to the fourth embodiment.

The substrate 100 is coated with the anti-reflection coating, and chemical amplified resist, and the desired pattern is reduced projection exposure via the reticle for exposure by a KrF excimer laser. After the substrate 100 is heat-treated (PEB), the substrate is conveyed to the developing unit, and held on the fixed base 101 (FIG. 8A).

In the conventional method, the development has heretofore been performed, in general, by subsequently discharging the developing solution directly onto the substrate to start the development, or discharging and throwing off the pure water by low-speed rotation to form a thin water layer on the substrate surface, wetting the substrate beforehand and enhancing the apparent wettability of the substrate surface to the developing solution, and subsequently discharging the developing solution onto the substrate.

Figure 8D:
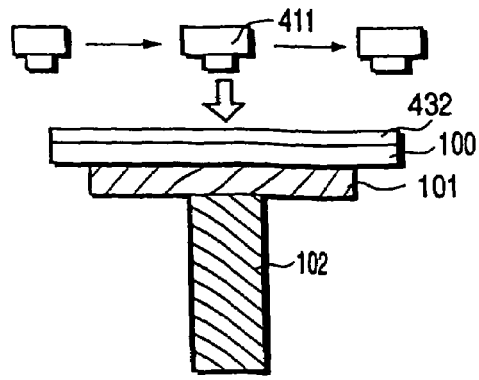
Figure 8B:
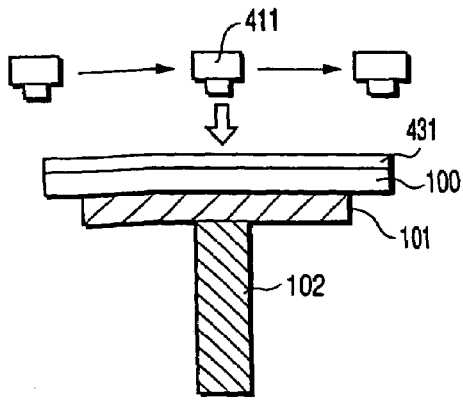

In the fourth embodiment, the solution supply nozzle 411 is scanned on the substrate 100 in one direction from the outside of the periphery of the substrate 100, and about 1 ppm of the dissolved hydrogen water is discharged via the nozzle so that a dissolved hydrogen water film 431 is formed on the substrate 100 surface (FIG. 8B). The whole surface of the substrate 100 is exposed to the solution film of the dissolved hydrogen water 431 for five to 30 seconds and only the resist surface is reduced. Additionally, the dissolved hydrogen water is a solution obtained by dissolving hydrogen in the pure water.

Figure 8E:
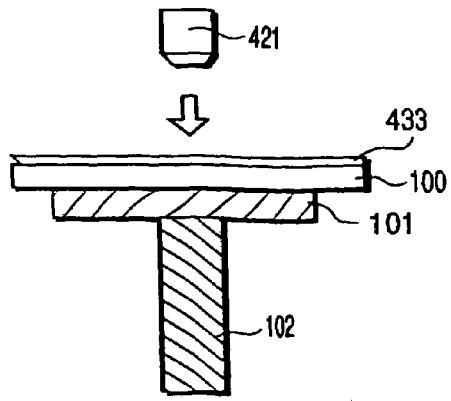
Figure 8C:
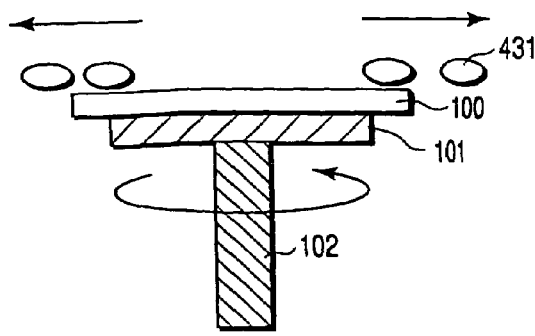

Subsequently, after an elapse of five to 30 seconds after the dissolved hydrogen water film 431 is formed, the substrate 100 is rotated at 2000 rpm, and the dissolved hydrogen water film 431 formed on the substrate 100 is thrown off and removed (FIG. 8C).

Subsequently, the solution supply nozzle is scanned from one end to the other end of the substrate, and the developing solution is discharged via the nozzle 411, so that a solution film of the developing solution 432 is formed on the 100 (FIG. 8D).

After the elapse of the time in which the desired pattern is obtained, the ultrapure water is discharged as a cleaning solution 433 onto the substrate 100 via the cleaning solution supply nozzle 421 for ten seconds (FIG. 8E). The developing solution, dissolved products, and the like are rinsed with the ultrapure water, and the developing of the resist film is stopped.

Figure 8F:
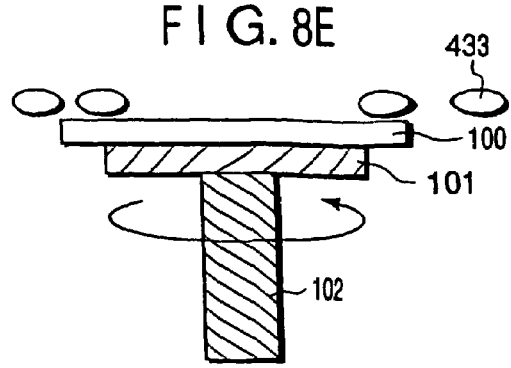

Subsequently, after the cleaning, the substrate is rotated at the high speed, the cleaning solution 433 is thrown off, and the substrate 100 surface is dried (FIG. 8F).

Figure 8G:
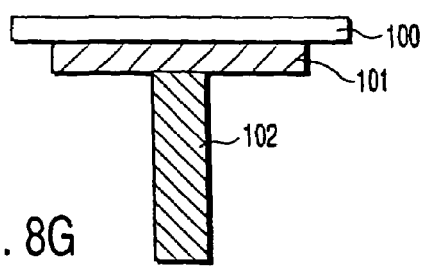

As described above, the developing process is ended, and the substrate is collected (FIG. 8G).

Moreover, the ultrapure water is used as the cleaning solution in the fourth embodiment. However, any one of the reducing solution, oxidizing solution, and pure water may be used, as long as the sufficient effect can be obtained. Furthermore, when the cleaning effect is enhanced, these solutions may appropriately be combined. As particularly preferable methods, there are a method of supplying the reducing solution and subsequently supplying the pure water to perform the cleaning, a method of supplying the oxidizing solution such as the ozonated water to clean the substrate and continuously cleaning the substrate with the reducing solution such as the dissolved hydrogen water, and the like.

An action of the pretreatment using the reducing solution will need be described.

For the exposed and heat-treated positive photosensitive resist, during the development, the affinity between the molecules of the exposed portion surface of the resist and the alkali ions in the developing solution is different in strength from the affinity between the molecules of the unexposed portion surface of the resist and the alkali ions in the developing solution. When the surface of the resist is treated by the dissolved hydrogen water before the development, carboxylic acid present in the exposed portion on the resist surface is reduced and changed to a hydroxyl group, and the affinity for the pure water and developing solution drops. Thereby, the difference of the affinity for the developing solution between the exposed portion surface and the unexposed portion surface can be alleviated. Usually, in a local region in which the exposed and unexposed portions are densely mixed, in accordance with the area ratio of the exposed portion/unexposed portion, the affinity received by the alkali ions in the developing solution also differs, and the difference of the developing speed is generated during the development. Since the development pretreatment by the dissolved hydrogen water is performed, the difference of the affinity in the local region is eliminated. As a result, the developing speed becomes substantially constant irrespective of pattern constitutions by the place such as the area ratio of the exposed portion/unexposed portion on the substrate. Therefore, the size uniformity after the development is enhanced. Even when the developing method by the hydrogen molecule dissolved developing solution described in the second embodiment is used, a similar effect is obtained. However, the development pretreatment does not proceed simultaneously with the development. Since the treatment is performed beforehand, the effect of surface property modification is particularly focused. In actual fact, in the development pretreatment using the dissolved hydrogen water, rather than the action of hydrogen during the development by the hydrogen molecule dissolved developing solution, the effect of the resist surface property modification remarkably appears, and the effect of alleviation of the difference of the affinity sensed by the alkali ions in the developing solution from the unexposed portion becomes more remarkable. For measurement of a contact angle, when the dissolved hydrogen water having a concentration of 1 PPM is exposed to the resist surface for 15 seconds, the contact angles of the exposed portion and unexposed portion to the developing solution are substantially equal.

Additionally, after the pretreatment using the dissolved hydrogen water, the substrate is rotated at 2000 RPM, and the dissolved hydrogen water film is removed. However, the film is not completely removed, the solution film of the dissolved hydrogen water is slightly left on the substrate, and continuously the developing solution film is formed on the dissolved hydrogen water film. Thereby, the dissolved hydrogen water and developing solution can be mixed on the substrate. In addition to the effect of the fourth embodiment, the effect described in the second embodiment is also obtained.

The result of an experiment actually performed by the inventor et al. in which the reducing solution is used to perform the pretreatment will be described hereinafter.

The experiment was carried out according to the procedure described in the fourth embodiment. Changes of size dispersions of the resist pattern (0.15 µmL/S) in the substrate surface with respect to a dissolved hydrogen water treatment time are shown in Table 4.

TABLE 4

| | Linear width (nm) | 3σ (nm) |
|---|---|---|
| Without dissolved hydrogen water pretreatment | 202.1 | 9.2 |
| With dissolved hydrogen water pretreatment | 198.4 | 4.8 |

When the dissolved hydrogen water pretreatment is performed, the size dispersion is clearly reduced, and the uniformity of the size, that is, the uniformity of development is enhanced.

In the fourth embodiment, the dissolved hydrogen water is used as the solution having reducing properties. However, the solution is not limited to the dissolved hydrogen water, as long as the solution has a reducing action. For example, it is considered that the aqueous solution containing $H_2S$, $HNO_3$, $H_2SO_3$, and the like, the hydrogen peroxide water, and the like have a similar effect.

Fifth Embodiment

FIG. 9 is a diagram showing the schematic constitution of the developing unit according to a fifth embodiment of the present invention. Additionally, in FIG. 9, the same components as those of FIG. 1 are denoted with the same reference numerals, and a detailed description is omitted.

As shown in FIG. 9, the developing unit includes a developing solution supply nozzle 511 for supplying the developing solution to the substrate 100, a solution supply nozzle 512 for supplying a solution described later, and a driving mechanism (not shown) for scanning the developing solution supply nozzle 511 and solution supply nozzle 512.

During the discharging of the developing solution, the developing solution supply nozzle 511 scans in one direction from the outside of the periphery of the substrate 100 over the substrate, and thereby supplies the developing solution to the whole surface of the substrate 100. Moreover, during the discharging of the solution, the solution supply nozzle 512 scans in one direction from the outside of the periphery of the substrate 100 over the substrate, and thereby supplies the solution to the whole surface of the substrate 100.

The constitution of a solution supply system for supplying the solution to the developing solution supply nozzle 511, solution supply nozzle 512, and cleaning solution supply nozzle 121 will next be described with reference to FIG. 10. FIG. 10 is a diagram showing the schematic constitution of the solution supply system of the developing unit shown in FIG. 9.

The developing solution can be directly supplied to the developing solution supply nozzle 511 from a developing solution supply tank 531. The pure water supplied from a pure water source 532 is supplied to the solution supply nozzle 512 directly, or via an oxidizing gas dissolution mechanism 540 or a reducing gas dissolution mechanism 550. The oxidizing gas dissolution mechanism 540 introduces the oxidizing gas generated by an oxidizing gas generator 541 into an oxidizing gas dissolved film 542, passes the pure water through the oxidizing gas dissolved film 542, and dissolves the oxidizing gas in the pure water. Moreover, the reducing gas dissolution mechanism 550 introduces the reducing gas generated by a reducing gas generator 551 into a reducing gas dissolved film 552, passes the pure water through the reducing gas dissolved film, and dissolves the reducing gas in the pure water.

Additionally, in the solution supply system shown in FIG. 10, the constitution includes two mechanisms, that is, the oxidizing gas dissolution mechanism 540 and reducing gas dissolution mechanism 550, but only one mechanism may be disposed where necessary. Moreover, when the gas can be in-line supplied, the gas generators 541, 551 are unnecessary.

Figure 11:
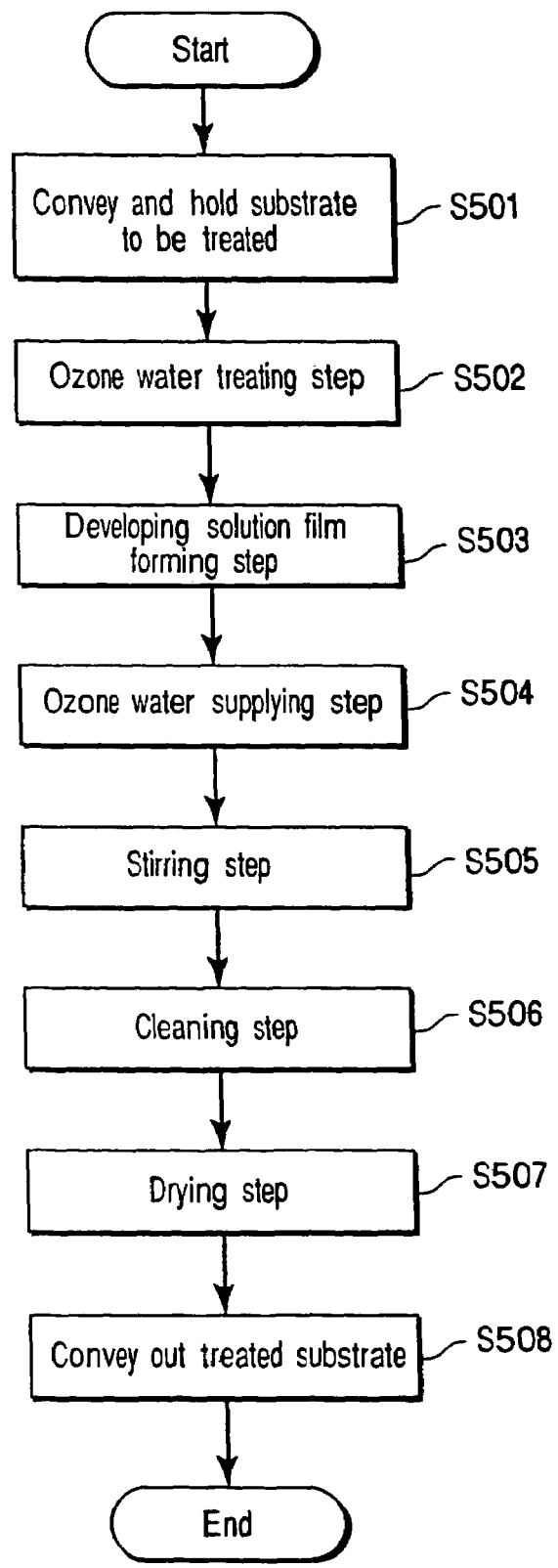
FIG. 11 is a flowchart showing the developing method according to a fifth embodiment.

The substrate is coated with the anti-reflection coating, and chemically amplified resist, and the desired pattern is reduced projection exposure via the reticle for exposure by a KrF excimer laser. After the substrate is heat-treated, the development is performed in a sequence shown in a flowchart of FIG. 11. Moreover, FIGS. 12A to 12I show process diagrams. FIG. 11 is a flowchart showing the developing method according to the fifth embodiment of the present invention. FIGS. 12A to 12I are process diagrams showing the developing process according to the fifth embodiment of the present invention.

The developing method of the fifth embodiment will be described in order with reference to the flowchart of FIG. 11 and process diagrams of FIGS. 12A to 12I.

(Conveying and Holding of Substrate: Step S501)

Figure 12A:
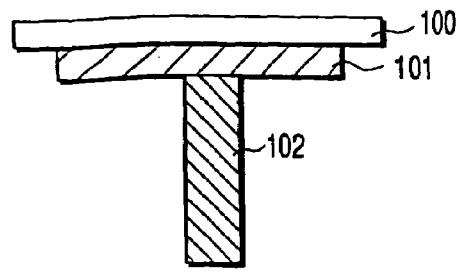
FIGS. 12A to 12I are process diagrams showing the developing process according to the fifth embodiment.

The substrate 100 is conveyed into the developing unit, and held onto the fixed base 101 (FIG. 12A).

(Pretreatment Step: Step S502)

Figure 12B:
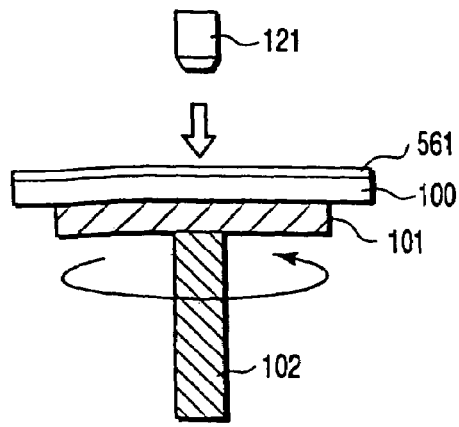
Figure 12C:
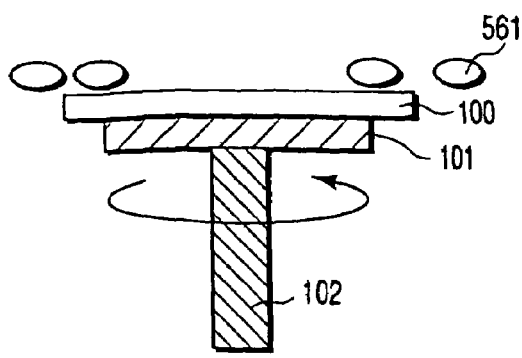

Subsequently, the cleaning solution supply nozzle 121 discharges ozonated water as the oxidizing solution to form the solution film of ozonated water 561 on the substrate (FIG. 12B). The ozonated water 561 is generated by passing the pure water through the oxidizing gas dissolved film 542 in which ozone generated by the oxidizing gas generator 541 is introduced. Thereafter, the substrate 100 is rotated, the ozonated water 561 is thrown off, and the substrate 100 surface is dried (FIG. 12C).

(Developing Solution Film Forming Step: Step S503)

Figure 12D:
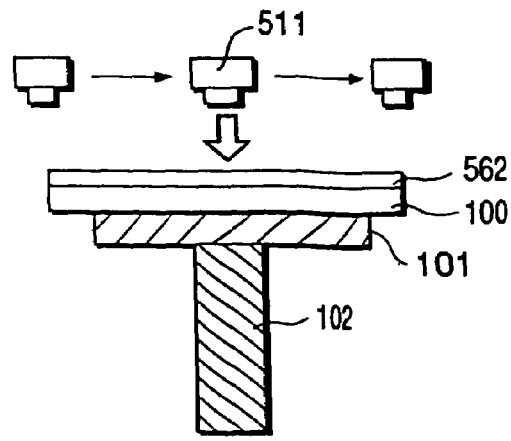

Subsequently, the developing solution supply nozzle 511 is scanned from one end to the other end of the substrate 100, the developing solution is discharged in a curtain form, and a developing solution film 562 is formed on the substrate 100 (FIG. 12D).

(Solution Supply Step: Step S504)

Figure 12E:
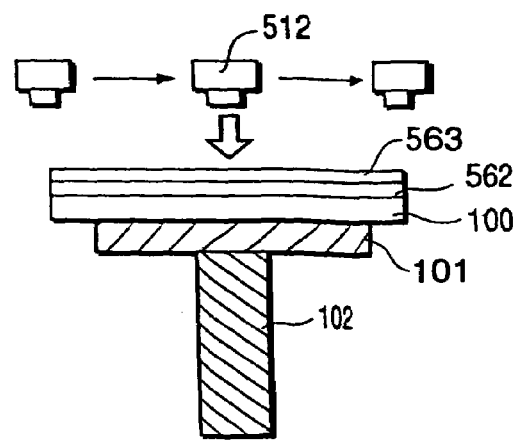

Subsequently, the solution supply nozzle 512 is scanned from one end to the other end of the substrate, the ozonated water as the oxidizing solution is discharged in a curtain form, and an ozonated water film 563 is formed on the developing solution film 562 (FIG. 12E).

(Agitating Step: Step S505)

Figure 12F:
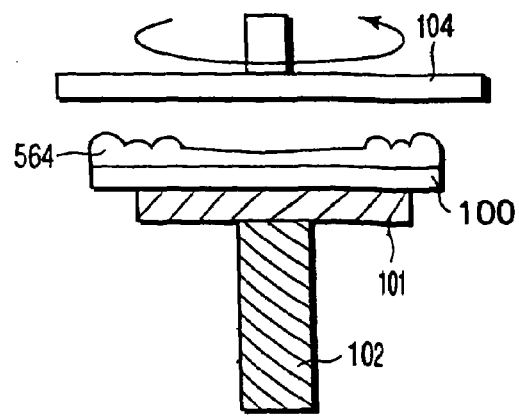

After the current plate 104 on the substrate is moved downwards, the current plate 104 is rotated to form an air current on the substrate 100 surface, and the developing solution film 562 and ozonated water film 563 are agitated by the air current (FIG. 12F). By the agitating, the developing solution film 562 and ozonated water film 563 formed on the substrate 100 are sufficiently mixed, and the concentration unevenness of the developing solution caused by the reaction products in the developing solution film 562 is removed.

(Cleaning Step: Step S506)

Figure 12G:
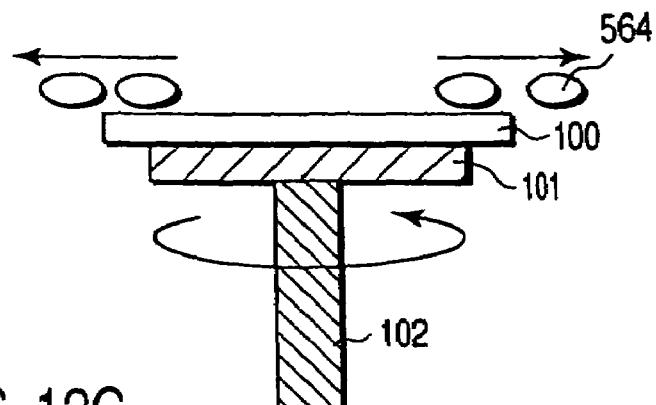
Figure 12H:
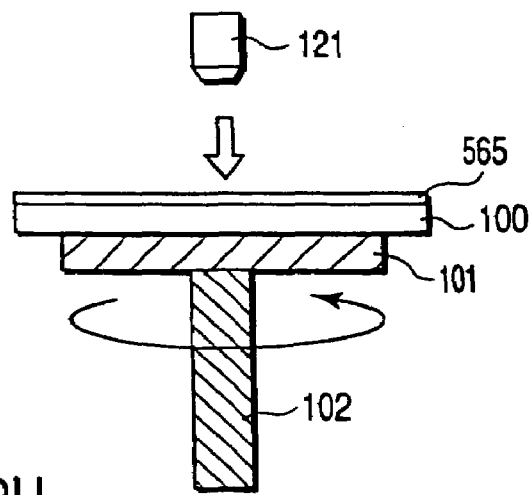

After an elapse of time for obtaining the desired pattern, the substrate 100 is rotated and the cleaning solution supply nozzle 121 discharges the dissolved hydrogen water as the reducing solution onto the substrate 100. The dissolved hydrogen water washes away the developing solution, reaction products, and the like, and the development is stopped (FIG. 12G).

(Drying Step: Step S507)

Figure 12I:
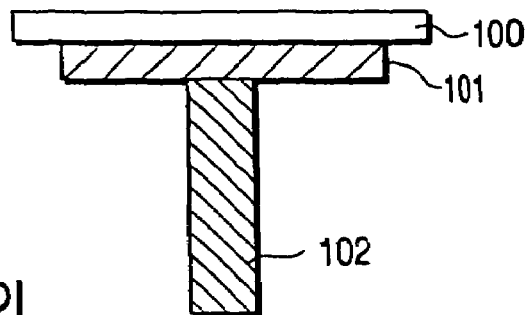

After the cleaning, the rotation mechanism 102 rotates the substrate 100 at the high speed (FIG. 12H), and the substrate is dried (FIG. 12I).

(Convey Out Substrate: Step S508)

As described above, the developing steps end, and the substrate 100 is collected.

Additionally, the forming method of the developing solution film or the ozonated water film is not limited to the method of scanning the linear developing solution supply nozzle from one end to the other end of the substrate and forming the solution film. Examples of the method include a method of relatively rotating the linear nozzle with respect to the substrate on the substrate and discharging the solution to form the solution film, a method of spraying the solution uniformly onto the whole surface of the substrate via the spray nozzle to form the solution film, and the like. The method is not limited as long as the solution film can uniformly be formed on the substrate. Moreover, examples of the agitating method of the formed solution film include a method of rotating the substrate, a method of vibrating the solution by a vibrator from the outside, and the like. Any method may be used as long as the method has the action of fluidizing the developing solution on the whole substrate surface.

In the pretreatment step and solution supply step, the ozonated water obtained by passing ozone gaseous molecules through the dissolved film and dissolving the molecules in pure water is used as the oxidizing solution. However, as long as a similar effect is produced, the gaseous molecules to be dissolved are not limited to ozone, and oxidizing gases such as oxygen, carbon monoxide, and hydrogen peroxide may be used.

In the present embodiment, the oxidizing solution and the developing solution are applied to the substrate and are agitated together on the substrate, thereby forming a film of oxidizing developing solution. If the film, thus formed, has too high an oxidizing ability, it will oxidize and decompose not only the reaction product (later described), but also the resist. The film will be inevitably damage the resist. In view of this, the gas should not be dissolved in the solution at an excessively high concentration. Ozone and hydrogen peroxide, which are strong oxidizing gases, should be dissolved at a concentration of 100 ppm or less in the oxidizing developing solution. On the other hand, oxygen and carbon monoixide, which are relatively weak oxidizing gases, should be dissolved at the saturation concentration or a lower concentration. In this embodiment, oxygen is dissolved at a concentration of 10 ppm in the developing solution.

Moreover, as the reducing solution in the cleaning step, the dissolved hydrogen water obtained by passing hydrogen gaseous molecules through the dissolved film and dissolving the molecules in pure water is used. However, when the similar effect is produced, not only hydrogen but also the reducing gases such as $H_2S$, $HNO_3$, and $H_2SO_3$ may be used as the gaseous molecules to be dissolved. Moreover, after supplying the reducing solution, to enhance the cleaning effect, the pure water may be supplied to clean the substrate. Moreover, before supplying the reducing solution, to enhance the cleaning effect, the oxidizing solutions such as the ozonated water may be supplied. As the cleaning solution, the combination of the reducing solution, oxidizing solution, and pure water can appropriately be selected, if the cleaning effect is enhanced.

The action obtained from the pretreatment using the oxidizing solution, and by the developing solution including the oxidizing solution in the fifth embodiment will be described hereinafter.

(1) Action of Oxidizing Solution in Pretreatment Step: Oxidization/Property Modification of Resist Surface During the development, a strong affinity exists between the molecules on the exposed portion surface of the photosensitive resist and the alkali ions in the developing solution. On the other hand, when the molecules of the unexposed portion surface of the photosensitive resist and the alkali ions in the developing solution approach each other, free energy becomes high, and a repulsive force operates. Therefore, in the region in which the area ratio of the exposed portion to the unexposed portion on the resist film to be treated differs, the affinity received from the resist surface by alkali ions largely differs. As a result, the amount of the alkali ions reaching the resist surface changes with the area ratio of the exposed portion to the unexposed portion, and the progress of the development also changes. That is, the developing speed differs with place on the resist surface to be treated. Therefore, the uniformity of the resist pattern size after the development in the plane is deteriorated. When the ozone molecules in the ozonated water for use in the pretreatment contact the resist surface, the resist surface is known to be oxidized. Since the resist surface of the exposed/unexposed portion is oxidized by the ozone molecules, carboxylic acid is generated. Carboxylic acid has a relatively strong affinity for alkali ions. Therefore, the difference in the affinity between the exposed portion and the unexposed portion is alleviated. As a result, the difference of the developing speed locally generated during the development is reduced, and the uniformity within the plane after the development is enhanced.

Moreover, there is a problem in the developing step that the defect is generated by the resist reaction product adhering to the resist surface. This is because the affinity by intermolecular interaction works between the resist surface and the particle surface of the cohering reaction products. The ozone molecules can oxidize the resist surface, generate carboxylic acid, and change the affinity using the intermolecular interaction in the resist surface and the surface of the reaction product particle. The reaction product particles possibly forming the defect after the development is inhibited from adhering to the resist surface. Therefore, when the pretreatment is performed with the ozonated water using the oxidizing properties, the organic matter defect adhering to the resist pattern after the development can largely be inhibited from being generated in the developing step.

(2-1) First Action of Developing Solution Including Oxidizing Solution: Oxidation/Decomposition of Reaction Product For the exposed, and heat-treated positive photosensitive resist, during the development, the exposed portion is dissolved, and the unexposed portion is hardly dissolved. In the developing step, when the exposed portion of the photosensitive resist contacts the developing solution, the dissolution starts and simultaneously the reaction product by neutralization is generated. The reaction product is diffused in the solution, but a part of the product is weakly bonded to the resist resin and remains between the resist patterns without being diffused. The reaction product remaining between the patterns coheres, and forms an organic particle. In the region in which the exposed portion has a large area and the pattern size is fine, many organic particles exist, and the concentration of alkali ions in the developing solution is lowered in the vicinity of the particles. As a result, the developing speed of the resist pattern locally slows in the vicinity of the particles, and the uniformity of the size of the resist pattern after the development is deteriorated. Moreover, when these organic particles adhere to the resist surface and cohere, the particles possibly remain as defects on the resist pattern after the development.

When the developing solution is mixed with the oxidizing solution on the substrate, the ozone molecules turn into oxygen molecules. During the development, the oxygen molecules in the developing solution collide with the reaction products caused by the development. It is further considered that the reaction products are oxidized, and decomposed, with a certain probability. A molecular mass of the decomposed reaction becomes low. Therefore, the decomposed reactions have a mass sufficiently reduced, and are therefore easily diffused in the solution. When the oxygen molecules having a sufficient concentration exist in the developing solution, the reaction products are oxidized and decomposed with an enhanced ratio, the diffusion of the reaction products into the developing solution is promoted, and the amount of organic particles piled up between the resist patterns or in the vicinity of the resist surface is reduced. Moreover, it can also be expected that the alkali ions in the developing solution are easily diffused in the reaction surface. When this effect is strong, the solution does not have to be agitated in the developing step. Needless to say, the diffusion is promoted by the agitating. As a result, the local drop in the alkali ion concentration of the developing solution is inhibited, and the developing speed unevenness in the substrate surface can be inhibited from being generated. Moreover, the organic particles are oxidized/decomposed, and diffused in the solution. Therefore, the probability at which the organic matter adhesion defect remaining on the resist pattern after the development is generated can remarkably be reduced.

(2-2) Second Action of Developing Solution including Oxidizing Solution: Dissolution Contrast Increase with Concentration Drop of Developing Solution When the developing solution is supplied onto the substrate, the oxidizing solution is supplied, and the solutions are agitated, the following action is obtained. Since the developing solution having a high concentration is first supplied, a large part of an exposed region is developed. However, in this case, a large amount of alkali is consumed, and the difference of the alkali concentration with the place is generated. As a result, the developing speed changes with the place, and a size dispersion is generated. Thereafter, even when the alkali concentration is restored by the agitating, the concentration entirely increases. Therefore, the development is further promoted regardless of a place where the development progresses or does not progress before the agitating. As a result, the development progresses while the first size difference is left.

However, after supplying the developing solution, the oxidizing solution is supplied and agitated, so that the alkali concentration entirely drops and the concentration is uniformed in the state. Therefore, where the development progresses up to a weak optical image, the development is not promoted. Conversely, where the development progresses only to a relatively strong optical image, the development progresses. A dissolution contrast increases in this manner. As a result, the first size dispersion resulting from the concentration dispersion is largely reduced.

(2-3) Third Action of Developing Solution including Oxidizing Solution: Inhibition of Cohesion of Reaction Products During the development, the generated reaction products cohere in the developing solution, and the size gradually increases. In the first action of the developing solution including the oxidizing solution, it has been described that the generated reaction products are oxidized and decomposed by oxygen in the developing solution. However, the amount of eluted reaction products, and further the number of molecules included in each reaction product is large as compared with the number of oxygen molecules in the solution. Therefore, it is impossible to oxidize and decompose all the products. The reaction products remaining without being decomposed can be the core of cohesion in the solution. When there are molecules as the core of cohesion in the solution, the reaction products in the solution start cohering centering to on the core. This cohesion is caused because the affinity of the reaction products is relatively strong under this environment, that is, particularly in the developing solution. That is, the molecules constituting the surface of the reaction product do not directly exert an interaction on the surface molecules of another reaction product present in the periphery. The molecules indirectly attract one another via the ions and molecules in the developing solution in order to further stabilize the state. Since the developing solution contains oxygen molecules, the energy in the interface of the reaction product and developing solution can be lowered. Therefore, the affinity acting on the reaction products apparently changes in the weakening direction. Even when the molecules as the prospective core of cohesion exist in the solution, the probability of the cohesion starting actually from the core is sufficiently low as compared with when oxygen is not contained in the solution. Therefore, in the developing solution containing oxygen, the generation probability of the cohesion by the reaction products is reduced. Moreover, even for the reaction products starting cohering, since the affinity causing the to cohesion is weakened, the growth speed slows. Therefore, the cohesion of the reaction products is inhibited.

Moreover, the difference of the affinity for the developing solution of the exposed portion/the unexposed portion is alleviated, and further the diffusion of the reaction products into the solution is promoted. From this action, in the agitating step during the development, even when a slight oscillating force is applied, a agitating can be efficiently performed.

(3) Action of Cleaning by Reducing Solution: Prevention of Reaction Product from Re-Adhering to Resist Surface Even when the reaction products generated by the developing reaction are decomposed by the oxygen molecules in the developing solution, and diffused in the developing solution, the reaction products sometimes re-adhere to the resist due to the interaction between the reaction products and the resist surface, in the cleaning step.

The use of the cleaning solution obtained by dissolving hydrogen molecules in pure water has the effect that the hydrogen molecules improve the reaction products or the surface state of the resist. This can weaken the degree of intermolecular interaction between the reaction products and the resist surface. That is, the amount of reaction products re-adhering to the resist surface is decreased, and the amount of defects causing the re-adhesion of reaction products to the resist surface is largely inhibited.

The results of the experiment actually performed by the inventor, et al. in order to check the effects of the pretreatment by the oxidizing solution and the use of the developing solution including the oxidizing solution will be described hereinafter.

The experiment was carried out according to the above-described procedure. To confirm the effect of the present invention, five samples were prepared while changing the steps S502, S504, S505, S506, and 3σ and defect number were measured. The results of the experiment are shown in Table 5. The pattern formed in each sample is a 130 nm isolated/remaining pattern.

TABLE 5

| Process | Ozonated water pre-treatment (step S502) | Ozonated water supply (step S504) | Stir (step S505) | Clean (step S506) | 3σ [nm] | Defect Number |
|---|---|---|---|---|---|---|
| Sample 1 | None | None | None | Pure water clean | 9.2 | 245 |
| Sample 2 | Present | None | None | Pure water clean | 8.5 | 130 |
| Sample 3 | None | Present | Present | Pure water clean | 7.5 | 50 |
| Sample 4 | Present | Present | Present | Pure water clean | 4.1 | 25 |
| Sample 5 | Present | Present | Present | Hydrogen water clean | 4.2 | 14 |

In Sample 1 obtained by simply forming and cleaning the developing solution film, the value of 3σ indicating the uniformity was 9.2 nm. On the other hand, with "Sample 2" obtained by the ozonated water pretreatment, the value of 3σ was enhanced to 8.5 nm. Furthermore, with "Sample 3" obtained by supplying and agitating the ozonated water during the development, the value of 3σ was enhanced to 7.5 nm. With "Sample 4" obtained by the ozonated water pretreatment and the supplying and agitating of the ozonated water during the development, the value of 3σ was 4.1 nm. Moreover, for "Sample 5" obtained by the ozonated water pretreatment, the supplying and agitating of the ozonated water during the development, and the cleaning with the dissolved hydrogen water, the value of 3σ was 4.2 nm.

Moreover, after the development, the organic matter adhesion defect number for the whole substrate surfaces of these samples were measured. In Sample 1, 245 defects were measured. In Sample 2, 130 defects were measured. In sample 3, 50 defects were measured. In Samples 4 and 5, 25 and 14 defects were measured, respectively. It has been found that the number of defects is reduced.

Sixth Embodiment

Since the constitutions of the developing unit and solution supply system for use in a sixth embodiment are similar to those of the fifth embodiment, the description thereof is omitted.

Figure 13:
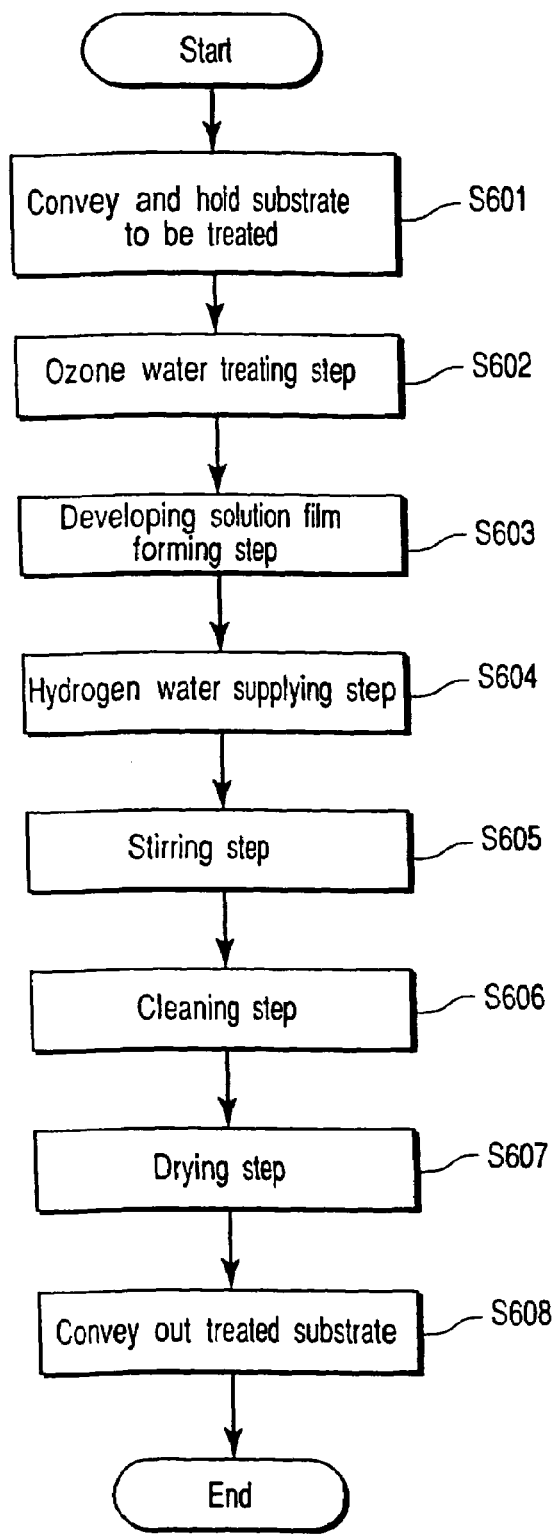
FIG. 13 is a flowchart showing the developing method according to a sixth embodiment.

The substrate is coated with the anti-reflection coating, and chemically amplified resist, and the desired pattern is reduced projection exposure via the reticle for exposure by a KrF excimer laser. After the substrate is heat-treated, the development is performed in a sequence shown in a flowchart of FIG. 13. Moreover, FIGS. 14A to 14I show diagrams for development process. FIG. 13 is a flowchart showing the developing method according to the sixth embodiment of the present invention. FIGS. 14A to 14I are diagrams showing the developing process according to the sixth embodiment of the present invention.

The developing method of the sixth embodiment will be described in order with reference to the flowchart of FIG. 13 and diagrams of FIGS. 14A to 14I.

(Conveying and Holding of Substrate: Step S601)

Figure 14A:
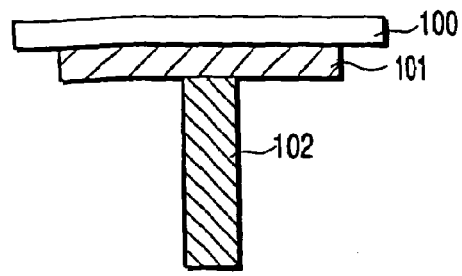

The substrate 100 is conveyed into the developing unit, and held onto the fixed base 101 (FIG. 14A).

(Dissolved hydrogen water Treatment (Pretreatment) Step: Step S602)

Figure 14B:
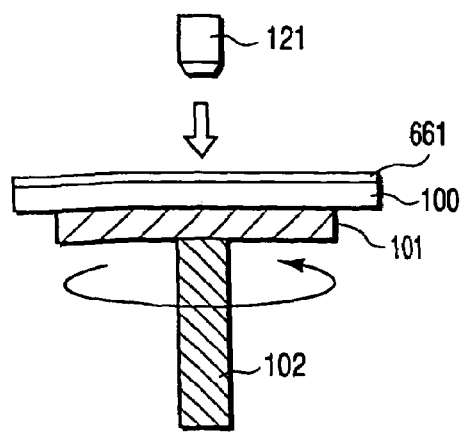
Figure 14C:
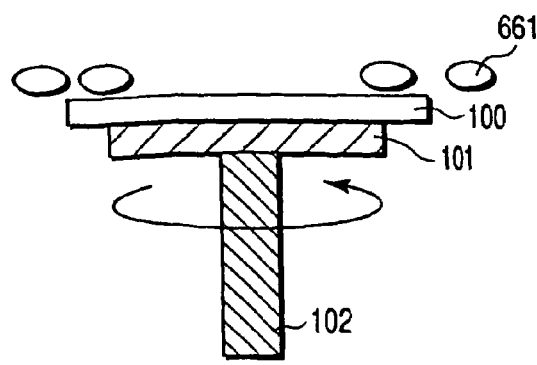

Subsequently, the cleaning solution supply nozzle 121 discharges the dissolved hydrogen water as the reducing solution to form the solution film of dissolved hydrogen water 661 on the substrate 100 (FIG. 14B). The dissolved hydrogen water 661 is generated by passing pure water through the reducing gas dissolved film 552 in which hydrogen generated by the reducing gas generator 551 is introduced. Thereafter, the substrate 100 is rotated, the dissolved hydrogen water 661 is thrown off, and the substrate 100 surface is dried (FIG. 14C).

(Developing Solution Film Forming Step: Step S603)

Figure 14D:
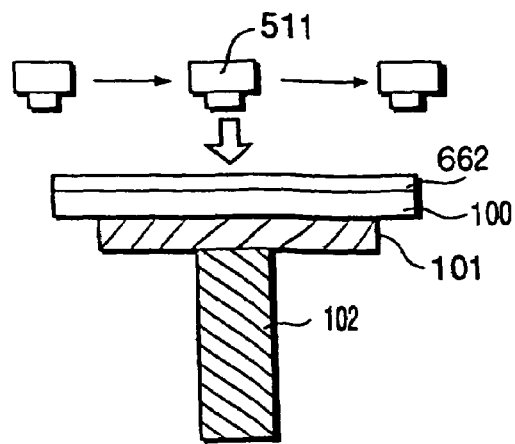

Subsequently, the developing solution supply nozzle 511 is scanned from one end to the other end of the substrate 100, the developing solution is discharged in a curtain form, and a developing solution film 662 is formed on the substrate 100 (FIG. 14D).

(Dissolved hydrogen water Supply Step: Step S604)

Figure 14E:
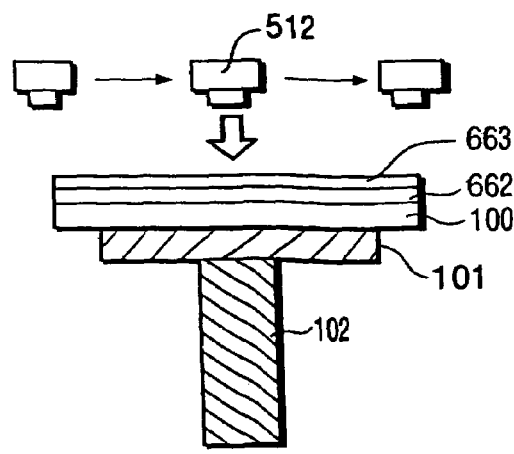

Subsequently, the solution supply nozzle 512 is scanned from one end to the other end of the substrate, the dissolved hydrogen water as the reducing solution is discharged in a curtain form, and a dissolved hydrogen water film 663 is formed on the developing solution film 662 (FIG. 14E).

(Agitating Step: Step S605)

Figure 14F:
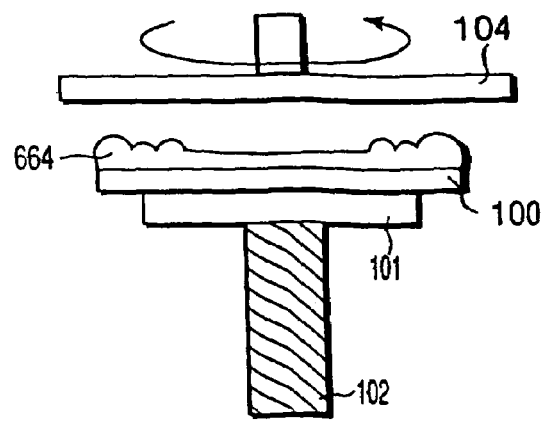

After the current plate 104 on the substrate is moved downwards, the current plate 104 is rotated to form an air current on the substrate 100 surface, the developing solution film and dissolved hydrogen water film 663 are agitated by the air current, and a mixed solution 664 is formed (FIG. 14F). By this agitating, the developing solution film 662 and dissolved hydrogen water film 663 formed on the substrate 100 are sufficiently mixed, and the concentration unevenness of the developing solution caused by the reaction products in the developing solution 662 is removed.

(Cleaning Step: Step S606)

After the elapse of time for obtaining the desired pattern, the substrate 100 is rotated and the cleaning solution supply nozzle 121 discharges the dissolved hydrogen water as the reducing solution onto the substrate 100 (FIG. 14G). The dissolved hydrogen water washes away the developing solution, reaction products, and the like, and the development is stopped.

(Drying Step: Step S607)

After the cleaning, the rotation mechanism 102 rotates the substrate 100 at a high speed (FIG. 14H), and the substrate 100 surface is dried (FIG. 14I).

(Convey out Substrate: Step S608)

As described above, the developing steps end, and the substrate 100 is recovered.

Additionally, the forming method of the developing solution film or the dissolved hydrogen water film is not limited to the method of scanning the linear developing solution supply nozzle from one end to the other end of the substrate. Examples of other methods are relatively rotating the linear nozzle with respect to the substrate on the substrate and discharging the solution to form the solution film, spraying the solution uniformly onto the whole surface of the substrate via the spray nozzle to form the solution film, and the like. The method is not limited as long as the solution film can be uniformly formed on the substrate. Moreover, the agitating method of the formed solution film comprises: rotating the current plate on the substrate to generate the air current. However, other methods way involve rotating the substrate, vibrating the solution from the outside, and the like. Any method may be used as long as the action of fluidizing the developing solution on the whole substrate surface is brought about.

In the pretreatment step and solution supply step, the dissolved hydrogen water obtained by passing hydrogen gaseous molecules through the dissolved film and dissolving the molecules in the pure water is used as the reducing solution. However, as long as a similar effect is produced, the gaseous molecules to be dissolved are not limited to hydrogen, and the reducing gases such as $H_2S$, $HNO_3$, and $H_2SO_3$ may be used. Moreover, as described in the first embodiment, the oxidizing solutions such as ozonated water may be used as the solution of the pretreatment step.

Moreover, in the cleaning step, the ozonated water obtained by introducing the ozone gaseous molecules in the dissolved film and dissolving the molecules in the pure water is used as the oxidizing solution. However, as long as a similar effect is produced, the gaseous molecules to be dissolved are not limited to ozone, and the oxidizing gases such as oxygen, carbon monoxide, and hydrogen peroxide may be used.

Furthermore, as the reducing solution in the cleaning step, the dissolved hydrogen water obtained by introducing the hydrogen gaseous molecules in the dissolved film and dissolving the molecules in pure water is used. However, when a similar effect is produced, the gaseous molecules to be dissolved are not limited to hydrogen. The reducing gases such as $H_2S$, $HNO_3$, and $H_2SO_3$ may be used. Moreover, after supplying the reducing solution, pure water may be supplied to clean the substrate. As the cleaning solution, the combination of the reducing solution, oxidizing solution, and pure water can appropriately be selected, if the cleaning effect is enhanced.

The actions of the pretreatment by the reducing solution, and the cleaning by the developing solution including the reducing solution and the oxidizing solution in the sixth embodiment will be described next.

(1) Action of Reducing Solution in Pretreatment Step: Property Modification of Resist Surface For the exposed and heat-treated positive photosensitive resist film, during the development, the affinity between the molecules of the exposed portion surface of the resist and the alkali ions in the developing solution is different in strength from the affinity between the molecules of the unexposed portion surface of the resist and the alkali ions in the developing solution. Therefore, in the region in which the area ratio of the exposed portion to the unexposed portion on the resist film to be treated differs, the affinity received from the resist surface by the alkali ions largely differs. As a result, the amount of alkali ions flowing into the resist surface changes with the area ratio of the exposed portion to the unexposed portion, and the progress speed of the development also changes. That is, the developing speed differs with the place on the resist surface to be treated. Therefore, the uniformity of the resist pattern size after the development is deteriorated.

The hydrogen molecules have an action of reducing the resist surface upon contacting the resist surface. Therefore, the difference of the affinity of the exposed portion surface and unexposed portion surface for the developing solution is alleviated. Thereby, the difference of the developing speed locally generated during the development is reduced, and the size uniformity after the development is enhanced.

(2-1) First Action of Developing Solution containing Reducing Solution: Promotion of Diffusion of Reaction Products into Developing Solution For the positive resist, in the developing step, the exposed portion is dissolved in the developing solution, whereas the unexposed portion has a property of being hardly dissolved. This is because for the exposed portion of the photosensitive resist, the reaction products generated by the neutralization with the developing solution are dissolved in the developing solution. However, when the area ratio of the exposed portion to the unexposed portion on the resist to be treated differs, the generated amount of the reaction products largely differs. For example, with the isolated pattern, since the broad exposed portion exists in the periphery, the amount of reaction products is remarkably large as compared with the L/S pattern. Since the reaction products easily remain between the patterns, and are not easily diffused in the developing solution, the alkali concentration of the developing solution around the isolated pattern is low as compared with the alkali concentration of the L/S pattern. Therefore, a time necessary for forming the desired pattern size differs with the pattern. That is, since the time required for the development differs with the difference of the pattern, the sparse/dense size difference of the resist pattern size after the development disadvantageously increases. For the sparse/dense difference, it is difficult to completely remove the reaction products only by agitating the products in the course of the development and improve the size difference.

When the hydrogen molecules contained in the developing solution are reduced/reacted with the reaction products generated by the neutralization, the surface potential of the reaction products changes. Thereby, the repulsive force is generated among the reaction products and the products are prevented from cohering to one another, so that the reaction products are easily diffused in the developing solution, and the development progresses. That is, when the surface potential of the reaction products is changed by the hydrogen molecules, the sparse/dense size difference generated by the alkali concentration difference of the developing solution can largely be reduced. Of course, it is needless to say that the diffusion of the reaction products is promoted by adding the agitating.

(2-2) Second Action of Developing Solution including Reducing Solution: Dissolution Contrast Increase with Concentration Drop of Developing Solution When the developing solution is supplied onto the substrate, and the reducing solution is supplied and agitated, the following action is obtained. Since the developing solution having a high concentration is first supplied, a large part of the exposed region is developed. However, in this case, a large amount of alkali is consumed, and the difference of the alkali concentration with the place is generated. As a result, the developing speed changes with the place, and a size dispersion is generated. Thereafter, even when the alkali concentration is restored by the agitating, the concentration entirely increases. Therefore, the development is further promoted regardless of the place where the development progresses or does not progress before the agitating. As a result, the development progresses while the first size difference is left. However, after supplying the developing solution, the reducing solution is supplied and agitated, so that the alkali concentration entirely drops and the concentration is uniformed in the state. Therefore, where the development progresses up to the weak optical image, the development is not promoted. Conversely, where the development progresses only to the relatively strong optical image, the development progresses. The dissolution contrast increases in this manner. As a result, the first size dispersion resulting from the concentration dispersion is largely reduced.

(2-3) Third Action of Developing Solution Including Reducing Solution: Alleviation of Cohesion of Reaction Products Even when the reaction products generated by the developing reaction are once diffused in the developing solution, the reaction products later possibly cohere by the interaction acting among the reaction products in the solution. Therefore, the problem is that the cohering reaction products again adhere onto the resist and form the defects.

When the hydrogen molecules are contained in the developing solution, the hydrogen molecules have an effect of modifying the reaction products, or the surface state of the resist. Thereby, the degree of the intermolecular interaction between the reaction products can be weakened, and the hydrogen molecules in the developing solution can inhibit the reaction products from cohering. That is, the amount of reaction products again adhering to the resist surface is decreased, and the amount of defects caused by re-adhesion of the cohering reaction products to the resist surface is largely suppressed.

(3) Action of Cleaning by Oxidizing Solution: Oxidation/Decomposition of Adhering Organic Particles For the exposed, and heat-treated positive photosensitive resist, during the development, the exposed portion is dissolved, and the unexposed portion is hardly dissolved. In the developing step, when the exposed portion of the photosensitive resist contacts the developing solution, the dissolution starts and simultaneously the reaction product by neutralization is generated. The reaction product is diffused in the solution, but a part of the product is weakly bonded to the resist resin and remains between the resist patterns without being diffused. The reaction product remaining between the patterns coheres, and forms organic particles. When these organic particles adhere to the resist surface and cohere, the particles possibly remain as defects on the resist pattern after the development.

When the oxidizing solution is used as the cleaning solution, the organic particles are oxidized/decomposed, and diffused in the solution. Therefore, the probability of generation of the organic matter adhesion defects remaining on the resist pattern after the development can remarkably be reduced.

Action of Cleaning by Reducing Solution: Prevention of Reaction Product from re-adhering to Resist Surface Even when the reaction products generated by the developing reaction are decomposed by the oxygen molecules in the developing solution, and diffused in the developing solution, the reaction products sometimes re-adhere to the resist as the defects, due to the interaction between the reaction products and the resist surface in the cleaning step.

The use of the cleaning solution obtained by dissolving hydrogen molecules in pure water has an effect that the hydrogen molecules improve the reaction products or the surface state of the resist. This can weaken the degree of the intermolecular interaction between the reaction products and the resist surface. That is, the amount of reaction products re-adhering to the resist surface is decreased, and the amount of defects causing the re-adhesion of the reaction products to the resist surface is largely inhibited.

The results of the experiment actually performed by the inventor, et al. in order to check the effects of the pretreatment by the reducing solution, the development using the developing solution including the reducing solution, and the cleaning by the oxidizing solution will next be described.

The experiment was carried out according to the above-described procedure. To confirm the effect of the present invention, five samples were prepared while changing the steps S602, S604, S605, S606, and 3a and the defect number was measured. The results of the experiment are shown in Table 6. The pattern formed in each sample is a 130 nm isolated pattern.

In Sample 6 obtained by forming and cleaning the developing solution film, the value of $3\sigma$ indicating the uniformity was 9.2 nm. The value of $3\sigma$ of Sample 7 obtained by the dissolved hydrogen water treatment was 8.4 nm. The value of $3\sigma$ of Sample 8 obtained by supplying and agitating the dissolved hydrogen water during the development was 6.5 nm. The values of $3\sigma$ of Samples 9, 10 obtained by performing the dissolved hydrogen water pretreatment, and supplying and agitating the dissolved hydrogen water during the development are 4.1 nm and 4.0 nm, respectively, and are enhanced as compared with Samples 6 to 8.

Moreover, after the development, the organic matter adhesion defect numbers on the whole substrate surfaces of these samples were measured. In Sample 6, 245 defects were measured. In Samples 7 and 8, 150 and 45 defects were measured, respectively, and the number of defects was reduced as compared with Sample 6. Furthermore, in Samples 9 and 10, 40 and 10 defects were measured, respectively. It has been found that the number of defects was further reduced.

Seventh Embodiment

Figure 15:
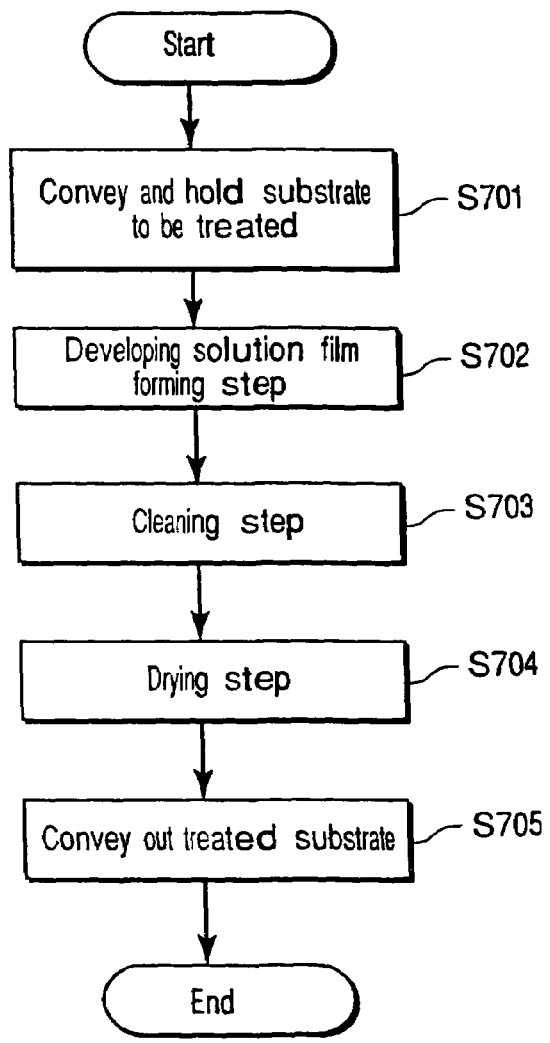
FIG. 15 is a flowchart showing a treatment procedure of the developing method according to a seventh embodiment.

FIG. 15 is a flowchart showing the treatment procedure of the developing method according to a seventh embodiment of the present invention. Moreover, FIGS. 16A to 16E are diagrams showing the developing method according to the seventh embodiment of the present invention.

(Conveying and Holding of Substrate: Step S701)

Figure 16A:
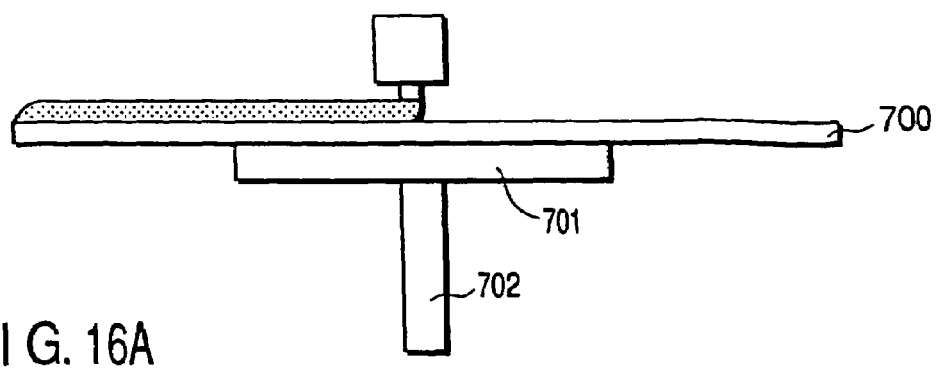
FIGS. 16A to 16E are process diagrams showing the developing method according to the seventh embodiment.

After using the KrF excimer laser to reduced projection exposure the desired pattern via the reticle for exposure on the anti-reflection coating and chemically amplified resist with which the surface is coated, a heat-treated (PEB) substrate 700 is conveyed into the developing unit by a conveyance robot (not shown), and held onto a fixed base 701 by suction (FIG. 16A).

(Developing Solution Film Forming Step: Step S702)

Figure 16C:
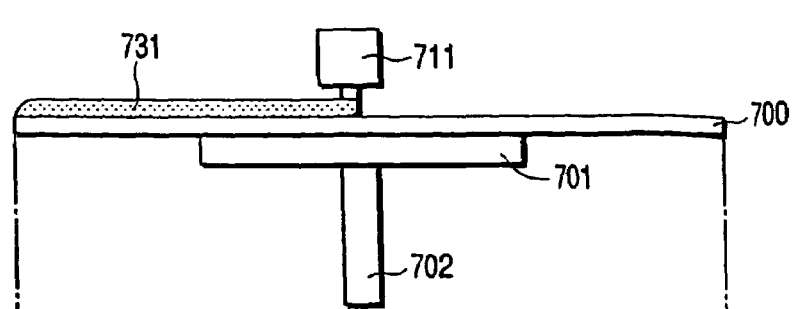
Figure 16B:
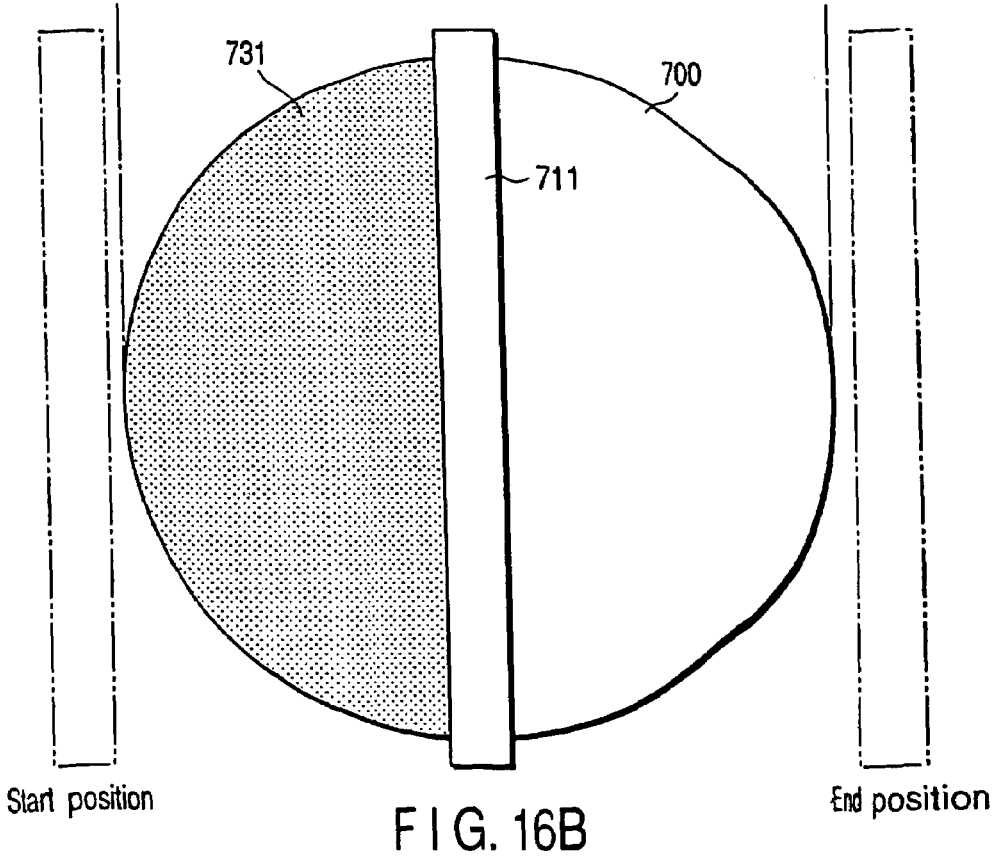

Subsequently, as shown in FIGS. 16B, 16C, a linear developing solution supply nozzle 711 is scanned from one end to the other end of the substrate 700, the developing solution is discharged in a curtain form via a supply port of the developing solution supply nozzle 711, and a developing solution film 731 is formed on the substrate 700. Additionally, FIG. 16B is a plane view, and FIG. 16C is a sectional view of FIG. 16B. For the developing solution supply nozzle 711 of the seventh embodiment, a supply amount distribution of a direction (depth direction of the drawing surface) vertical to the scanning direction is kept constant.

Here, a relation between a developing solution film thickness formed on the substrate according to the seventh embodiment of the present invention and a developing solution supply nozzle 711-substrate 700 gap will be described with reference to FIGS. 17A to 17C.

Figure 17A:
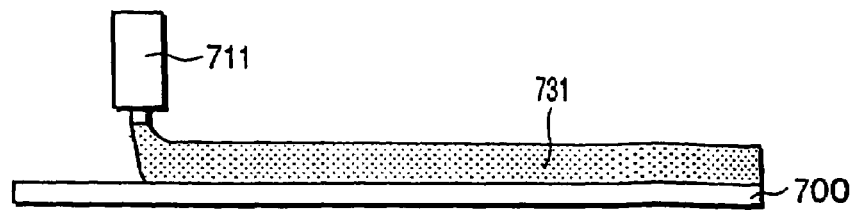
FIGS. 17A to 17C are explanatory views of a method of controlling a developing solution film thickness formed on a substrate according to the seventh embodiment.

First, to form the solution film, when the gap between the developing solution supply nozzle 711 and the substrate 700 is large as compared with the formed solution film thickness (d<<H), as shown in FIG. 17A, the developing solution discharged from the developing solution supply nozzle 711 is pulled upwards by the developing solution supply nozzle 711. Therefore, the film thickness of a developing solution 731 during the solution supply is thick as compared with the thickness in a steady state, and a vertical interval is made. Therefore, during the stop of the supply of the developing solution in the terminal end of the substrate 700, a flow of the developing solution is generated from counteraction in a direction in which the film thickness of the developing solution film 731 is thin. This flow of the developing solution possibly generates a dispersion of a pattern size after the development.

Figure 17B:

On the other hand, when the gap between the nozzle and the substrate is extremely small as compared with the formed developing solution film thickness (d>>H), as shown in FIG. 17B, the developing solution discharged from the developing solution supply nozzle 711 is pushed out of the developing solution supply nozzle 711. The thickness of the developing solution film 731 during the supply of the developing solution is small as compared with the steady state, and the vertical interval is made. Therefore, during the stop of the supply of the developing solution in the terminal end of the substrate 700, the flow of the developing solution is generated in the direction in which the solution film thickness is thin. The size dispersion by the flow of the developing solution is possibly generated depending on the vertical interval between the developing solution supply nozzle 711-substrate 700 gap and the film thickness of the developing solution film 731.

Figure 17C:
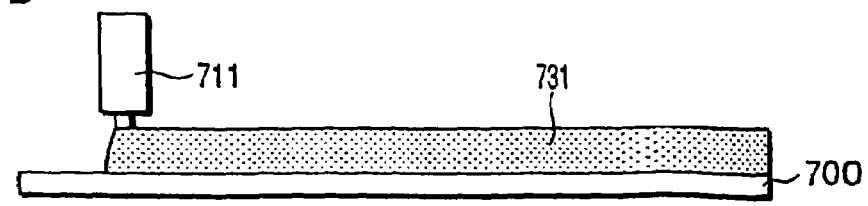

Therefore, in order to remove a size fluctuation with the solution flow generated by the developing solution supply nozzle 711-substrate 700 gap and the film thickness of the developing solution film 731, as shown in FIG. 17C, the developing solution supply nozzle 711-substrate 700 gap is set to be substantially the same as the film thickness of the developing solution film 731, and the developing solution is supplied. Thereby, the developing solution supply nozzle 711 is scanned, and the developing solution is supplied, so that the generated flow of the solution can be removed. That is, the flow of the developing solution by scanning the developing solution supply nozzle 711 is inhibited, and it is possible to largely reduce the size dispersion in the plane depending on the scanning direction or the size dispersion in the chip.

When the developing solution supply nozzle 711 supplies the developing solution, and the developing solution supply nozzle 711 is scanned from one end to the other end of the substrate 700 to form the developing solution film, the thickness of the developing solution film 731 is determined by the relative speed of the scanning speed of the developing solution supply nozzle 711 and the supply speed of the developing solution from the developing solution supply nozzle 711.

Concretely, when the length of the supply port of the developing solution supply nozzle 711 is defined as L (mm), the nozzle scanning speed is V (mm/sec), the developing solution supply speed is Q (μl/sec), the formed solution film thickness is d (mm), and the gap is H (mm), at least one of the nozzle scanning speed V (mm/sec), the developing solution supply speed Q (μl/sec), and the gap H (mm) is controlled.

$$d \approx H \quad (1)$$

$$d = Q/(V \times L) \quad (2)$$

(Step S703: Cleaning Step)

Figure 16D:
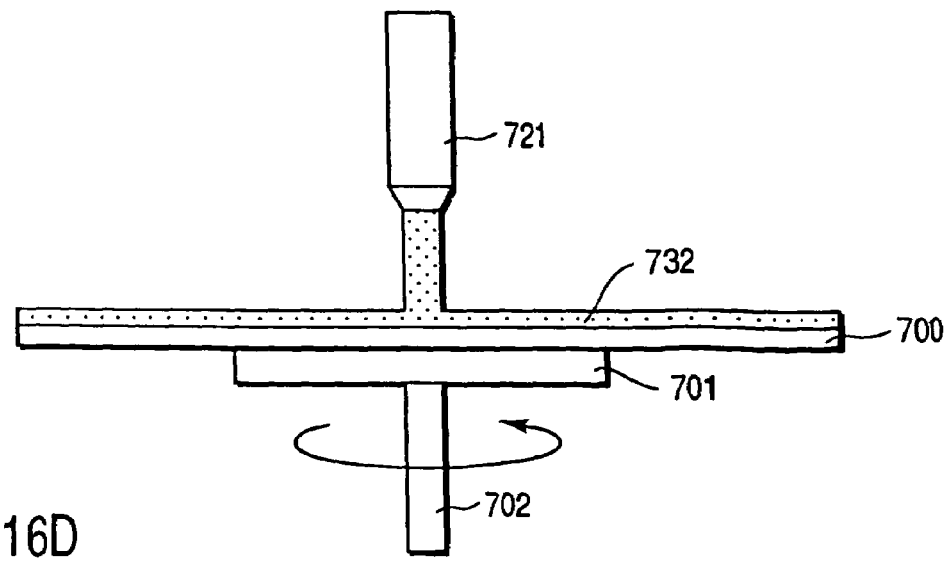

After the elapse of a predetermined time after the solution film is formed, as shown in FIG. 16D, a rinse nozzle 721 disposed above the substrate 700 supplies a rinse solution (e.g., pure water) 732, a rotation mechanism 702 rotates the substrate 700, and the substrate 700 is cleaned.

(Step S704: Drying Step)

Figure 16E:
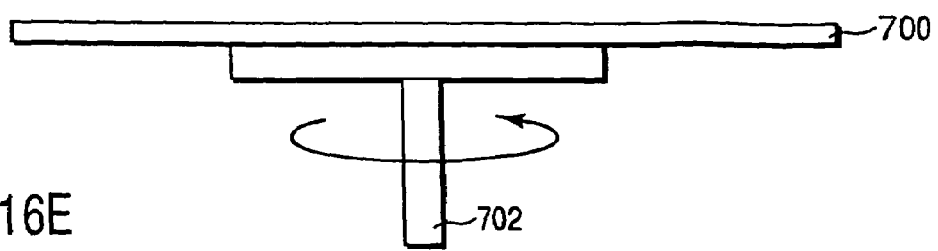

Furthermore, as shown in FIG. 16E, the substrate 700 is rotated at high speed, the rinse solution is thrown off, and the substrate 700 is dried.

(Step S705: Convey Out Substrate)

Subsequently, the completely dried substrate 700 is conveyed out of the developing unit by a conveyance robot (not shown).

Figure 18:
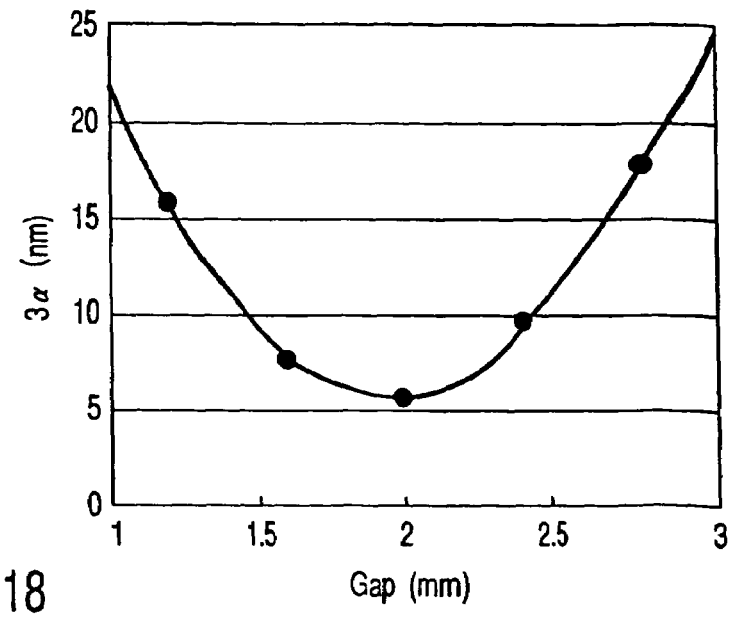
FIG. 18 is a characteristic diagram showing a size uniformity of an isolated line in a chip of a time at which a gap between a developing solution supply nozzle and a substrate is changed.

The present embodiment will next be described based on actual experiment results. FIG. 18 shows the size uniformity of an isolated line in the chip of a time at which the gap between the developing solution supply nozzle 711 and the substrate 700 is changed. On the experiment conditions that the scanning speed V of the developing solution supply nozzle 711=50 mm/sec, the developing solution supply speed Q=20 ml/sec, and the length L of the supply port of the developing solution supply nozzle 711 L=200 mm, the film thickness of the formed developing solution film is d=2.0 mm from equation (2). However, when the substantially equal gap is given to the film thickness, the flow of the solution is removed. It is seen that the size uniformity in the substrate plane is enhanced.

Additionally, in the above-described embodiment, the solution film forming step of the developing solution has been described. However, the technique of the present embodiment can be used in forming the films of the developing solutions including a developing solution containing a reflection preventive material, a solution containing a photosensitive material, a solution containing a low dielectric material, a solution containing a ferroelectric material, a solution containing an electrode material, a solution containing a pattern transfer material, a solution containing a magnetic material for use in a donut-shaped storage medium, and a solution containing a light absorption reaction material for use in the donut-shaped storage medium.

Eighth Embodiment

A method of forming a uniform solution film will be described in an eighth embodiment. In the eighth embodiment, further control is added to the control described in the seventh embodiment.

Since the forming method of the developing solution is similar to that of the seventh embodiment, the description thereof is omitted. Only the control in the supply step of the developing solution will be described.

Similarly as the seventh embodiment, when the developing solution supply nozzle 711 supplies the developing solution, and the developing solution supply nozzle 711 is scanned from one end to the other end of the substrate 700 to form the developing solution film, the film thickness of the developing solution film is determined by a ratio of the scanning speed of the developing solution supply nozzle 711 to the supply speed of the developing solution from the developing solution supply nozzle 711. Concretely, when the length of the supply port of the developing solution supply nozzle 711 is defined as L (mm), the nozzle scanning speed is V (mm/sec), the developing solution supply speed is Q (μl/sec), the formed solution film thickness is d (mm), and the gap is H (mm), the formed solution film thickness d (mm) is approximately represented by the following equations.

$$d \approx H \quad (1)$$

$$d = Q/(V \times L) \quad (2)$$

Here, a method of controlling the nozzle scanning speed V (mm/sec) and the developing solution supply speed Q (μl/sec) will be described.

With the substrate 700 of a circular wafer, even when the developing solution film is formed via the developing solution supply nozzle 711 with the same developing solution supply speed and the same supply amount, the substantial supply amount of the developing solution differs with the place of the substrate because of the circular shape of the substrate. For example, as shown in FIG. 19A, when the developing solution supply nozzle 711 passes to the middle of the substrate 700 from the supply start end, the length (hereinafter referred to as the developing solution supply length) of the substrate 700 of the portion with the developing solution supplied onto the substrate from the developing solution supply nozzle 711 gradually increases. Therefore, as shown in FIG. 19B, force of a developing solution 831 flowing toward the outside of the circumference of the reaction product acts from the developing solution supply nozzle 711 due to the interaction of the developing solution 831 and substrate 700, and the film thickness of a formed developing solution film 832 becomes thin.

Moreover, as shown in FIG. 20A, while the developing solution supply nozzle 711 passes to the developing solution supply start end from the middle of the substrate 700, the developing solution supply length gradually decreases with the scanning of the developing solution supply nozzle 711. Therefore, as shown in FIG. 20B, a force is exerted such that the developing solution 831 supplied to the outside of the circumference of the substrate 700 from the developing solution supply nozzle 711 is attracted into the plane of the substrate 700. The film thickness of the formed developing solution film is increased. Thereby, during the stop of the supply of the developing solution in the terminal end of the substrate 700, the flow of the developing solution is generated toward the small solution film thickness. The size dispersion dependent on the flow of the developing solution is generated in the developing solution film 832 within the substrate plane.

In order to remove this difference in solution film thickness generated by the interaction of the developing solution and substrate, the developing solution supply speed Q (μl/sec), or the nozzle scanning speed V (mm/sec) is corrected, for example, with the following approximate equations (3), (4).

$$Q = Q_0 \{1 + \alpha \times (dl/l)\} \quad (3)$$

$$V = V_0 \{1 - \alpha' \times ((dl/l))\} \quad (4)$$

Here, the developing solution supply speed $Q_0$ (μl/sec) in the wafer middle, the nozzle scanning speed $V_0$ (mm/sec), and the gap H (mm) are set to satisfy the equations (1) and (2), and the developing solution supply speed Q (μl/sec) or the nozzle scanning speed V (mm/sec) is controlled in accordance with the position of the nozzle on the substrate. Concretely, the length of the supply port of the developing solution supply nozzle 711 is L (mm), a wafer radius is r (mm), the nozzle scanning speed is V (mm/sec), the formed solution film thickness is d (mm), and a scanning nozzle position from the wafer middle is x (mm) ($-r \leq x \leq r$). A change amount of the length l (mm) of the substrate of the portion with the developing solution supplied thereto during movement of the nozzle on the substrate by a unit distance (dx) is (dl/l), and α and α' are control factors of the developing solution supply speed and nozzle scanning speed.

When the developing solution supply speed Q (μl/sec) and the nozzle scanning speed V (mm/sec) are approximately corrected by the equations (3) and (4) in this manner, the solution film thickness d can be kept to be substantially constant.

Figure 21:
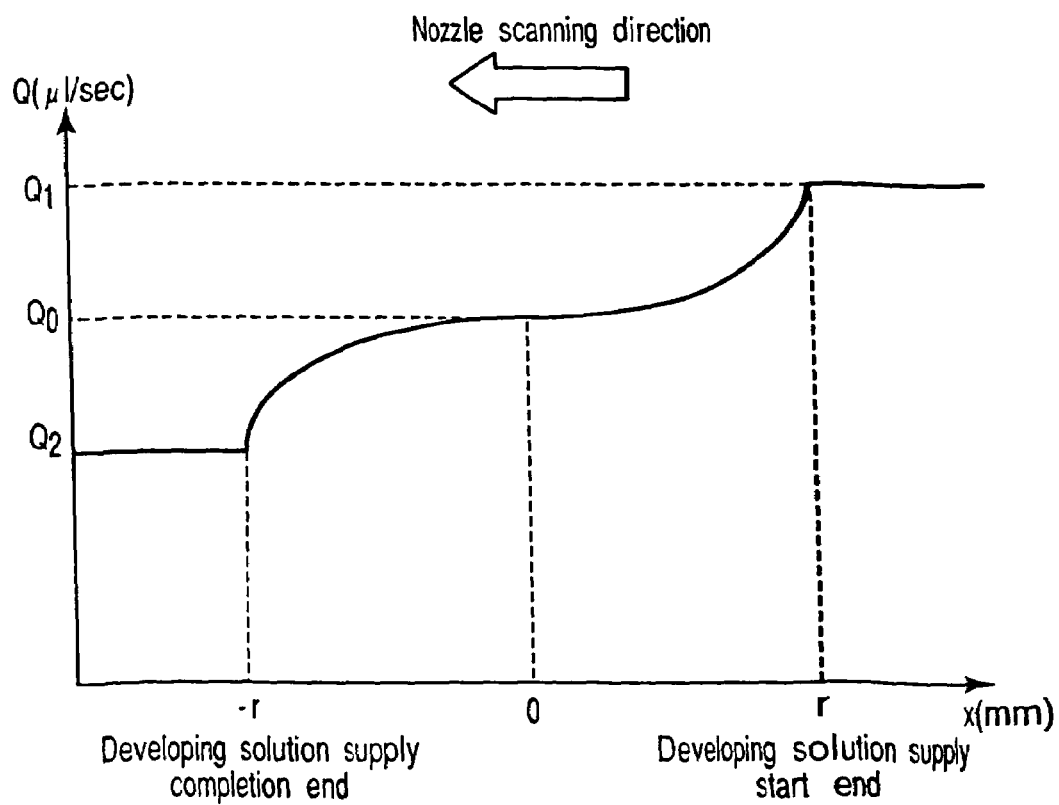
FIG. 21 is a characteristic diagram showing a developing solution supply speed Q (μl/sec) with respect to a position of the developing solution supply nozzle according to an eighth embodiment.
Figure 22:
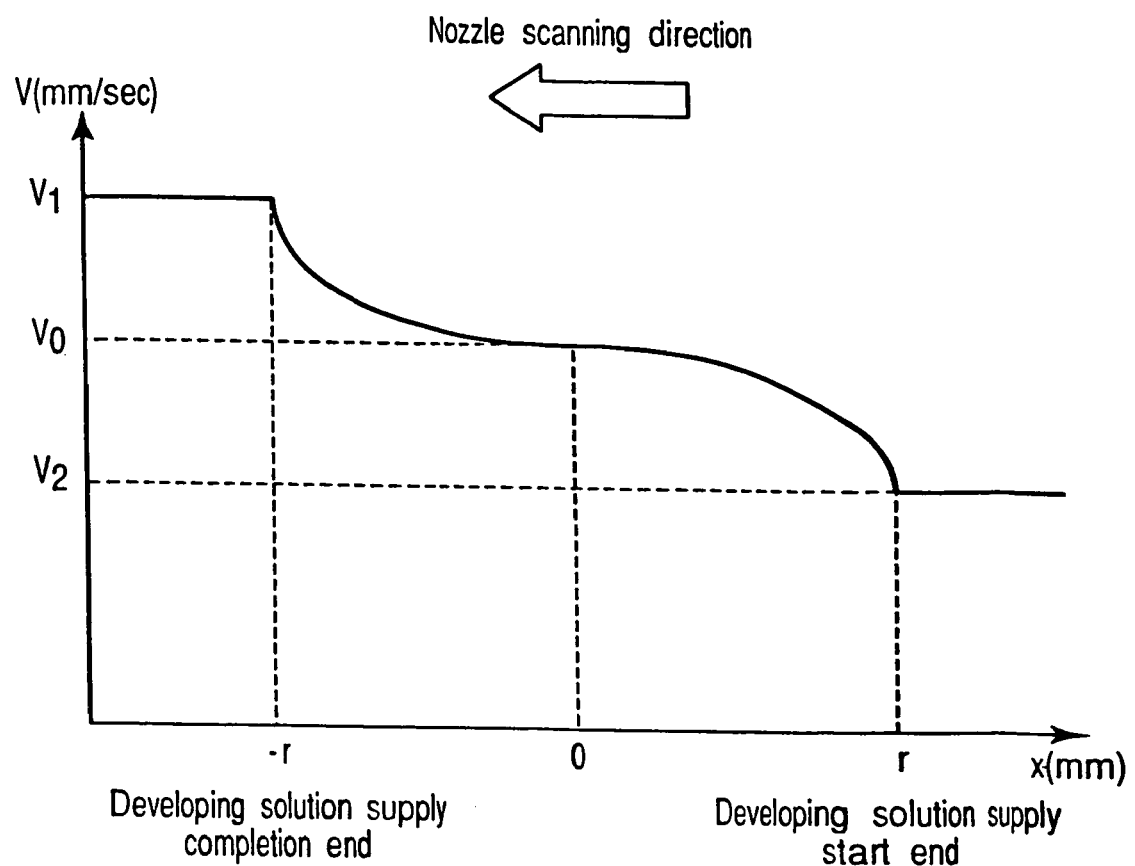
FIG. 22 is a characteristic diagram showing a nozzle scanning speed V (mm/sec) with respect to the position of the developing solution supply nozzle according to the eighth embodiment.

Concretely, as shown in FIG. 21, the developing solution supply speed Q (μl/sec) is controlled. This can eliminate the fluctuation of the developing solution film thickness generated by the developing solution supply method in which the nozzle is scanned from one end to the other end with a uniform developing solution supply speed. Accordingly, the flow of the solution can be inhibited. That is, when the flow of the developing solution is inhibited, the size uniformity in the substrate surface, and the size uniformity in the chip are enhanced. A similar effect can also be obtained when the nozzle scanning speed V (mm/sec) is controlled as shown in FIG. 22.

The present embodiment will next be described based on actual experiment results (Table 7).

TABLE 7

| | Average size | In-plane uniformity (3σ: nm) |
|---|---|---|
| Supply amount control nozzle | 197.2 | 5.9 |
| Conventional nozzle | 199.5 | 8.7 |

Assuming the nozzle scanning speed V=50 mm/sec, the developing solution supply speed $Q_0$=20 ml/sec in the wafer middle with the developing solution supply speed Q, and L=200 mm, the developing solution supply speed was controlled to satisfy the relation of the equation (3) and the developing solution was supplied. As a result of the experiment, the developing solution supply speed is controlled in accordance with the scanning point of the nozzle, and the size uniformity in the wafer plane is enhanced.

In addition, in the above-described embodiment, the solution film forming step of the developing solution has been described. However, the technique of the present embodiment can be used in forming the films of the solutions including the developing solution containing the reflection preventive material, the solution containing the photosensitive material, the solution containing the low dielectric material, the solution containing the ferroelectric material, the solution containing the electrode material, the solution containing the pattern transfer material, the solution containing the magnetic material for use in the donut-shaped storage medium, and the solution containing the light absorption reaction material for use in the donut-shaped storage medium.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
  coating a substrate with a photosensitive resist film;
  exposing said photosensitive resist film;
  supplying a developing solution, in which a gaseous molecule having at least one of ozone and carbon monoxide or at least one of hydrogen, $H_2S$, $HNO_3$, and $H_2SO_3$ is previously dissolved, to said photosensitive resist film, and developing the resist film; and
  supplying a cleaning solution to the surface of said substrate, and cleaning the substrate.

2. The pattern forming method according to claim 1, further comprising:
  discharging the developing solution to said photosensitive resist film from a developing solution supply nozzle;
  relatively moving said substrate and said developing solution supply nozzle;
  forming a developing solution film on the surface of the resist film; and
  developing said photosensitive resist film.

3. The pattern forming method according to claim 2, further comprising:
  fluidizing the developing solution film on said photosensitive resist film after said developing solution film is formed.

4. The pattern forming method according to claim 1, further comprising:
  supplying an oxidizing solution or a reducing solution as said cleaning solution to said substrate surface.

5. A manufacturing method of a semiconductor device, comprising:
  coating a substrate with a photosensitive resist film;
  exposing said photosensitive resist film;
  supplying a developing solution; with a gaseous molecule having at least one of ozone and carbon monoxide or at least one of hydrogen, $H_2S$, $HNO_3$, and $H_2SO_3$ previously dissolved therein, to said photosensitive resist film, and developing the resist film; and
  supplying a cleaning solution to the surface of said substrate, and cleaning the substrate.

* * * * *

UNITED STATES PATENT AND TRADEMARK OFFICE
CERTIFICATE OF CORRECTION

PATENT NO. : 7,399,578 B2
APPLICATION NO. : 11/493629
DATED : July 15, 2008
INVENTOR(S) : Takahashi et al.

Page 1 of 1

It is certified that error appears in the above-identified patent and that said Letters Patent is hereby corrected as shown below:

Column 36, line 19, change "solution;" to --solution,--.

Signed and Sealed this

Twenty-eighth Day of October, 2008

JON W. DUDAS
*Director of the United States Patent and Trademark Office*